(12) United States Patent
Haig et al.

(10) Patent No.: US 10,891,076 B1
(45) Date of Patent: Jan. 12, 2021

(54) RESULTS PROCESSING CIRCUITS AND METHODS ASSOCIATED WITH COMPUTATIONAL MEMORY CELLS

(71) Applicant: GSI Technology, Inc., Sunnyvale, CA (US)

(72) Inventors: Bob Haig, Sunnyvale, CA (US); Eli Ehrman, Sunnyvale, CA (US); Dan Ilan, Sunnyvale, CA (US); Patrick Chuang, Sunnyvale, CA (US); Chao-Hung Chang, Sunnyvale, CA (US); Mu-Hsiang Huang, Sunnyvale, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 16/152,374

(22) Filed: Oct. 4, 2018

Related U.S. Application Data

(63) Continuation-in-part of application No. 15/709,399, filed on Sep. 19, 2017, and a continuation-in-part of application No. 15/709,401, filed on Sep. 19, 2017, now Pat. No. 10,249,362, and a continuation-in-part of application No. 15/709,379, filed on Sep. 19, 2017, now Pat. No. 10,521,229, and a continuation-in-part of application No. 15/709,382, filed on Sep. 19, 2017, now Pat. No. 10,725,777, and a continuation-in-part of application No. 15/709,385, filed on Sep. 19, 2017, now Pat. No. 10,860,318.

(60) Provisional application No. 62/430,767, filed on Dec. 6, 2016, provisional application No. 62/430,762, filed on Dec. 6, 2016.

(51) Int. Cl.
*G11C 11/419* (2006.01)
*G06F 3/06* (2006.01)

(52) U.S. Cl.
CPC .......... *G06F 3/0659* (2013.01); *G06F 3/0604* (2013.01); *G06F 3/0644* (2013.01); *G06F 3/0683* (2013.01); *G11C 11/419* (2013.01)

(58) Field of Classification Search
CPC .... G11C 11/412; G11C 11/418; G11C 11/419
USPC ................ 365/156, 154, 189.15, 230.05
See application file for complete search history.

(56) References Cited

U.S. PATENT DOCUMENTS

| 3,451,694 A | 6/1969 | Hass |
| 3,747,952 A | 7/1973 | Graebe |

(Continued)

FOREIGN PATENT DOCUMENTS

| CN | 104752431 | 7/2015 |
| DE | 10133281 A1 | 1/2002 |
| JP | 2005-346922 | 12/2005 |

OTHER PUBLICATIONS

US 10,564,982 B1, 02/2020, Oh et al. (withdrawn)
(Continued)

*Primary Examiner* — Alfredo Bermudez Lozada

(57) ABSTRACT

A read and write data processing apparatus and method associated with computational memory cells formed as a memory/processing array (having a plurality of bit line sections) provides a mechanism to logically combine the computation results across multiple bit line sections in a section and across multiple sections, and transmit the combined result as an output of the processing array and/or store the combined result into one or more of those multiple bit line sections.

44 Claims, 20 Drawing Sheets

(56) References Cited

U.S. PATENT DOCUMENTS

| | | |
|---|---|---|
| 3,795,412 A | 3/1974 | John |
| 4,227,717 A | 10/1980 | Bouvier |
| 4,308,505 A | 12/1981 | Messerschmitt |
| 4,587,496 A | 5/1986 | Wolaver |
| 4,594,564 A | 6/1986 | Yarborough, Jr. |
| 4,677,394 A | 6/1987 | Vollmer |
| 4,716,322 A | 12/1987 | D'Arrigo et al. |
| 4,741,006 A | 4/1988 | Yamaguchi et al. |
| 4,856,035 A | 8/1989 | Lewis |
| 5,008,636 A | 4/1991 | Markinson |
| 5,302,916 A | 4/1994 | Pritchett |
| 5,375,089 A | 12/1994 | Lo |
| 5,382,922 A | 1/1995 | Gersbach |
| 5,400,274 A | 3/1995 | Jones |
| 5,473,574 A | 12/1995 | Clemen et al. |
| 5,530,383 A | 6/1996 | May |
| 5,535,159 A | 7/1996 | Nii |
| 5,563,834 A | 10/1996 | Longway et al. |
| 5,587,672 A | 12/1996 | Ranganathan et al. |
| 5,608,354 A | 3/1997 | Hori |
| 5,661,419 A | 8/1997 | Bhagwan |
| 5,696,468 A | 12/1997 | Nise |
| 5,736,872 A | 4/1998 | Sharma et al. |
| 5,744,979 A | 4/1998 | Goetting |
| 5,744,991 A | 4/1998 | Jefferson et al. |
| 5,748,044 A | 5/1998 | Xue |
| 5,768,559 A | 6/1998 | Iino et al. |
| 5,805,912 A | 9/1998 | Johnson et al. |
| 5,883,853 A | 3/1999 | Zheng et al. |
| 5,937,204 A | 8/1999 | Schinnerer |
| 5,942,949 A | 8/1999 | Wilson et al. |
| 5,963,059 A | 10/1999 | Partovi et al. |
| 5,969,576 A | 10/1999 | Trodden |
| 5,969,986 A | 10/1999 | Wong |
| 5,977,801 A | 11/1999 | Boerstler |
| 5,999,458 A | 12/1999 | Nishimura et al. |
| 6,005,794 A | 12/1999 | Sheffield et al. |
| 6,044,034 A | 3/2000 | Katakura |
| 6,058,063 A | 5/2000 | Jang |
| 6,072,741 A | 6/2000 | Taylor |
| 6,100,721 A | 8/2000 | Durec et al. |
| 6,100,736 A | 8/2000 | Wu et al. |
| 6,114,920 A | 9/2000 | Moon et al. |
| 6,115,320 A | 9/2000 | Mick et al. |
| 6,133,770 A | 10/2000 | Hasegawa |
| 6,167,487 A | 12/2000 | Camacho |
| 6,175,282 B1 | 1/2001 | Yasuda |
| 6,226,217 B1 | 5/2001 | Riedlinger et al. |
| 6,262,937 B1 | 7/2001 | Arcoleo et al. |
| 6,263,452 B1 | 7/2001 | Jewett et al. |
| 6,265,902 B1 | 7/2001 | Klemmer et al. |
| 6,286,077 B1 | 9/2001 | Choi et al. |
| 6,310,880 B1 | 10/2001 | Waller |
| 6,366,524 B1 | 4/2002 | Abedifard |
| 6,377,127 B1 | 4/2002 | Fukaishi et al. |
| 6,381,684 B1 | 4/2002 | Hronik et al. |
| 6,385,122 B1 | 5/2002 | Chang |
| 6,407,642 B2 | 6/2002 | Dosho et al. |
| 6,418,077 B1 | 7/2002 | Naven |
| 6,441,691 B1 | 8/2002 | Jones et al. |
| 6,448,757 B2 | 9/2002 | Hill |
| 6,473,334 B1 | 10/2002 | Bailey et al. |
| 6,483,361 B1 | 11/2002 | Chiu |
| 6,504,417 B1 | 1/2003 | Cecchi et al. |
| 6,538,475 B1 | 3/2003 | Johansen et al. |
| 6,567,338 B1 | 5/2003 | Mick |
| 6,594,194 B2 | 7/2003 | Gold |
| 6,642,747 B1 | 11/2003 | Chiu |
| 6,661,267 B2 | 12/2003 | Walker et al. |
| 6,665,222 B2 | 12/2003 | Wright et al. |
| 6,683,502 B1 | 1/2004 | Groen et al. |
| 6,683,930 B1 | 1/2004 | Dalmia |
| 6,732,247 B2 | 5/2004 | Berg et al. |
| 6,744,277 B1 | 6/2004 | Chang et al. |
| 6,757,854 B1 | 6/2004 | Zhao |
| 6,789,209 B1 | 9/2004 | Suzuki et al. |
| 6,816,019 B2 | 11/2004 | Delbo' et al. |
| 6,836,419 B2 | 12/2004 | Loughmiller |
| 6,838,951 B1 | 1/2005 | Nieri et al. |
| 6,842,396 B2 | 1/2005 | Kono |
| 6,853,696 B1 | 2/2005 | Moser et al. |
| 6,854,059 B2 | 2/2005 | Gardner |
| 6,856,202 B2 | 2/2005 | Lesso |
| 6,859,107 B1 | 2/2005 | Moon et al. |
| 6,882,237 B2 | 4/2005 | Singh et al. |
| 6,897,696 B2 | 5/2005 | Chang et al. |
| 6,933,789 B2 | 8/2005 | Molnar et al. |
| 6,938,142 B2 | 8/2005 | Pawlowski |
| 6,940,328 B2 | 9/2005 | Lin |
| 6,954,091 B2 | 10/2005 | Wurzer |
| 6,975,554 B1 | 12/2005 | Lapidus et al. |
| 6,998,922 B2 | 2/2006 | Jensen et al. |
| 7,002,404 B2 | 2/2006 | Gaggl et al. |
| 7,002,416 B2 | 2/2006 | Pettersen et al. |
| 7,003,065 B2 | 2/2006 | Homol et al. |
| 7,017,090 B2 | 3/2006 | Endou et al. |
| 7,019,569 B2 | 3/2006 | Fan-Jiang |
| 7,042,271 B2 | 5/2006 | Chung et al. |
| 7,042,792 B2 | 5/2006 | Lee |
| 7,042,793 B2 | 5/2006 | Masuo |
| 7,046,093 B1 | 5/2006 | McDonagh et al. |
| 7,047,146 B2 | 5/2006 | Chuang et al. |
| 7,053,666 B2 | 5/2006 | Tak et al. |
| 7,095,287 B2 | 8/2006 | Maxim et al. |
| 7,099,643 B2 | 8/2006 | Lin |
| 7,141,961 B2 | 11/2006 | Hirayama et al. |
| 7,142,477 B1 | 11/2006 | Tran et al. |
| 7,152,009 B2 | 12/2006 | Bokui et al. |
| 7,180,816 B2 | 2/2007 | Park |
| 7,200,713 B2 | 4/2007 | Cabot et al. |
| 7,218,157 B2 | 5/2007 | Van De Beek et al. |
| 7,233,214 B2 | 6/2007 | Kim et al. |
| 7,246,215 B2 | 7/2007 | Lu et al. |
| 7,263,152 B2 | 8/2007 | Miller et al. |
| 7,269,402 B2 | 9/2007 | Uozumi et al. |
| 7,282,999 B2 | 10/2007 | Da Dalt et al. |
| 7,312,629 B2 | 12/2007 | Chuang et al. |
| 7,313,040 B2 | 12/2007 | Chuang et al. |
| 7,330,080 B1 | 2/2008 | Stoiber et al. |
| 7,340,577 B1 | 3/2008 | Van Dyke et al. |
| 7,349,515 B1 | 3/2008 | Chew et al. |
| 7,352,249 B2 | 4/2008 | Balboni et al. |
| 7,355,482 B2 | 4/2008 | Meltzer |
| 7,355,907 B2 | 4/2008 | Chen et al. |
| 7,369,000 B2 | 5/2008 | Wu et al. |
| 7,375,593 B2 | 5/2008 | Self |
| 7,389,457 B2 | 6/2008 | Chen et al. |
| 7,439,816 B1 | 10/2008 | Lombaard |
| 7,463,101 B2 | 12/2008 | Tung |
| 7,464,282 B1 | 12/2008 | Abdollahi-Alibeik et al. |
| 7,487,315 B2 | 2/2009 | Hur et al. |
| 7,489,164 B2 | 2/2009 | Madurawe |
| 7,512,033 B2 | 3/2009 | Hur et al. |
| 7,516,385 B2 | 4/2009 | Chen et al. |
| 7,538,623 B2 | 5/2009 | Jensen et al. |
| 7,545,223 B2 | 6/2009 | Watanabe |
| 7,565,480 B2 | 7/2009 | Ware et al. |
| 7,577,225 B2 | 8/2009 | Azadet et al. |
| 7,592,847 B2 | 9/2009 | Liu et al. |
| 7,595,657 B2 | 9/2009 | Chuang et al. |
| 7,622,996 B2 | 11/2009 | Liu |
| 7,630,230 B2 | 12/2009 | Wong |
| 7,633,322 B1 | 12/2009 | Zhuang et al. |
| 7,635,988 B2 | 12/2009 | Madurawe |
| 7,646,215 B2 | 1/2010 | Chuang et al. |
| 7,646,648 B2 | 1/2010 | Arsovski |
| 7,659,783 B2 | 2/2010 | Tai |
| 7,660,149 B2 | 2/2010 | Liaw |
| 7,663,415 B2 | 2/2010 | Chatterjee et al. |
| 7,667,678 B2 | 2/2010 | Guttag |
| 7,675,331 B2 | 3/2010 | Jung et al. |
| 7,689,941 B1 | 3/2010 | Ooi et al. |
| 7,719,329 B1 | 5/2010 | Smith |
| 7,719,330 B2 | 5/2010 | Lin et al. |

(56) References Cited

U.S. PATENT DOCUMENTS

| | | |
|---|---|---|
| 7,728,675 B1 | 6/2010 | Kennedy et al. |
| 7,737,743 B1 | 6/2010 | Gao et al. |
| 7,746,181 B1 | 6/2010 | Moyal |
| 7,746,182 B2 | 6/2010 | Ramaswamy et al. |
| 7,750,683 B2 | 7/2010 | Huang et al. |
| 7,760,032 B2 | 7/2010 | Ardehali |
| 7,760,040 B2 | 7/2010 | Zhang et al. |
| 7,760,532 B2 | 7/2010 | Shirley et al. |
| 7,782,655 B2 | 8/2010 | Shau |
| 7,812,644 B2 | 10/2010 | Cha et al. |
| 7,830,212 B2 | 11/2010 | Lee et al. |
| 7,839,177 B1 | 11/2010 | Soh |
| 7,843,239 B2 | 11/2010 | Sohn et al. |
| 7,843,721 B1 | 11/2010 | Chou |
| 7,848,725 B2 | 12/2010 | Zolfaghari et al. |
| 7,859,919 B2 | 12/2010 | De La Cruz, II et al. |
| 7,876,163 B2 | 1/2011 | Hachigo |
| 7,916,554 B2 | 3/2011 | Pawlowski |
| 7,920,409 B1 | 4/2011 | Clark |
| 7,920,665 B1 | 4/2011 | Lombaard |
| 7,924,599 B1 | 4/2011 | Evans, Jr. et al. |
| 7,940,088 B1 | 5/2011 | Sampath et al. |
| 7,944,256 B2 | 5/2011 | Masuda |
| 7,956,695 B1 | 6/2011 | Ding et al. |
| 7,965,108 B2 | 6/2011 | Liu et al. |
| 8,004,920 B2 | 8/2011 | Ito et al. |
| 8,008,956 B1 | 8/2011 | Shin et al. |
| 8,044,724 B2 | 10/2011 | Rao et al. |
| 8,063,707 B2 | 11/2011 | Wang |
| 8,087,690 B2 | 1/2012 | Kim |
| 8,089,819 B2 | 1/2012 | Noda |
| 8,117,567 B2 * | 2/2012 | Arsovski .............. G11C 7/1006 365/154 |
| 8,174,332 B1 | 5/2012 | Lombaard et al. |
| 8,218,707 B2 | 7/2012 | Mai |
| 8,242,820 B2 | 8/2012 | Kim |
| 8,258,831 B1 | 9/2012 | Banai |
| 8,284,593 B2 | 10/2012 | Russell |
| 8,294,502 B2 | 10/2012 | Lewis et al. |
| 8,400,200 B1 | 3/2013 | Kim et al. |
| 8,488,408 B1 | 7/2013 | Shu et al. |
| 8,493,774 B2 | 7/2013 | Kung |
| 8,526,256 B2 | 9/2013 | Gosh |
| 8,542,050 B2 | 9/2013 | Chuang et al. |
| 8,575,982 B1 | 11/2013 | Shu et al. |
| 8,593,860 B2 | 11/2013 | Shu et al. |
| 8,625,334 B2 | 1/2014 | Liaw |
| 8,643,418 B2 | 2/2014 | Ma et al. |
| 8,692,621 B2 | 4/2014 | Snowden et al. |
| 8,693,236 B2 | 4/2014 | Shu |
| 8,817,550 B1 | 8/2014 | Oh |
| 8,837,207 B1 | 9/2014 | Jou |
| 8,885,439 B1 | 11/2014 | Shu et al. |
| 8,971,096 B2 | 3/2015 | Jung et al. |
| 8,995,162 B2 | 3/2015 | Sang |
| 9,018,992 B1 | 4/2015 | Shu et al. |
| 9,030,893 B2 | 5/2015 | Jung |
| 9,053,768 B2 | 6/2015 | Shu et al. |
| 9,059,691 B2 | 6/2015 | Lin |
| 9,070,477 B1 | 6/2015 | Clark |
| 9,083,356 B1 | 7/2015 | Cheng |
| 9,093,135 B2 | 7/2015 | Khailany |
| 9,094,025 B1 | 7/2015 | Cheng |
| 9,135,986 B2 | 9/2015 | Shu |
| 9,142,285 B2 | 9/2015 | Hwang et al. |
| 9,159,391 B1 | 10/2015 | Shu et al. |
| 9,171,634 B2 | 10/2015 | Zheng |
| 9,177,646 B2 | 11/2015 | Arsovski |
| 9,196,324 B2 | 11/2015 | Haig et al. |
| 9,240,229 B1 | 1/2016 | Oh et al. |
| 9,311,971 B1 | 4/2016 | Oh |
| 9,318,174 B1 | 4/2016 | Chuang et al. |
| 9,356,611 B1 | 5/2016 | Shu et al. |
| 9,384,822 B2 | 7/2016 | Shu et al. |
| 9,385,032 B2 | 7/2016 | Shu |
| 9,396,790 B1 | 7/2016 | Chhabra |
| 9,396,795 B1 | 7/2016 | Jeloka et al. |
| 9,401,200 B1 | 7/2016 | Chan |
| 9,412,440 B1 | 8/2016 | Shu et al. |
| 9,413,295 B1 | 8/2016 | Chang |
| 9,431,079 B1 | 8/2016 | Shu et al. |
| 9,443,575 B2 | 9/2016 | Yabuuchi |
| 9,484,076 B1 | 11/2016 | Shu et al. |
| 9,494,647 B1 | 11/2016 | Chuang et al. |
| 9,552,872 B2 | 1/2017 | Jung |
| 9,608,651 B1 | 3/2017 | Cheng |
| 9,613,670 B2 | 4/2017 | Chuang et al. |
| 9,613,684 B2 | 4/2017 | Shu et al. |
| 9,679,631 B2 | 6/2017 | Haig et al. |
| 9,685,210 B1 | 6/2017 | Ghosh et al. |
| 9,692,429 B1 | 6/2017 | Chang et al. |
| 9,697,890 B1 | 7/2017 | Wang |
| 9,722,618 B1 | 8/2017 | Cheng |
| 9,729,159 B1 | 8/2017 | Cheng |
| 9,789,840 B2 | 10/2017 | Farooq |
| 9,804,856 B2 | 10/2017 | Oh et al. |
| 9,847,111 B2 | 12/2017 | Shu et al. |
| 9,853,633 B1 | 12/2017 | Cheng et al. |
| 9,853,634 B2 | 12/2017 | Chang |
| 9,859,902 B2 | 1/2018 | Chang |
| 9,916,889 B1 | 3/2018 | Duong |
| 9,935,635 B2 | 4/2018 | Kim et al. |
| 9,966,118 B2 | 5/2018 | Shu et al. |
| 10,065,594 B2 | 9/2018 | Fukawatase |
| 10,153,042 B2 | 12/2018 | Ehrman |
| 10,192,592 B2 | 1/2019 | Shu et al. |
| 10,249,312 B2 | 4/2019 | Kim et al. |
| 10,249,362 B2 | 4/2019 | Shu |
| 10,388,364 B2 | 8/2019 | Ishizu et al. |
| 10,425,070 B2 | 9/2019 | Cheng et al. |
| 10,521,229 B2 | 12/2019 | Shu et al. |
| 10,535,381 B2 | 1/2020 | Shu et al. |
| 10,659,058 B1 | 5/2020 | Cheng et al. |
| 10,673,440 B1 | 6/2020 | Camarota |
| 10,770,133 B1 | 9/2020 | Haig et al. |
| 10,777,262 B1 | 9/2020 | Haig et al. |
| 10,854,284 | 12/2020 | Chuang et al. |
| 2001/0052822 A1 | 12/2001 | Kim et al. |
| 2002/0006072 A1 | 1/2002 | Kunikiyo |
| 2002/0060938 A1 | 5/2002 | Song |
| 2002/0136074 A1 | 9/2002 | Hanzawa et al. |
| 2002/0154565 A1 | 10/2002 | Noh et al. |
| 2002/0168935 A1 | 11/2002 | Han |
| 2003/0016689 A1 | 1/2003 | Hoof |
| 2003/0107913 A1 | 6/2003 | Nii |
| 2003/0185329 A1 | 10/2003 | Dickmann |
| 2004/0053510 A1 | 3/2004 | Little |
| 2004/0062138 A1 | 4/2004 | Partsch et al. |
| 2004/0090413 A1 | 5/2004 | Yoo |
| 2004/0160250 A1 | 8/2004 | Kim et al. |
| 2004/0169565 A1 | 9/2004 | Gaggl et al. |
| 2004/0199803 A1 | 10/2004 | Suzuki et al. |
| 2004/0240301 A1 | 12/2004 | Rao |
| 2004/0264279 A1 * | 12/2004 | Wordeman ........ G11C 11/40603 365/230.05 |
| 2004/0264286 A1 | 12/2004 | Ware et al. |
| 2005/0024912 A1 | 2/2005 | Chen et al. |
| 2005/0026329 A1 | 2/2005 | Kim et al. |
| 2005/0036394 A1 | 2/2005 | Shiraishi |
| 2005/0186930 A1 | 8/2005 | Rofougaran et al. |
| 2005/0226079 A1 | 10/2005 | Zhu et al. |
| 2005/0226357 A1 | 10/2005 | Yoshimura |
| 2005/0253658 A1 | 11/2005 | Maeda et al. |
| 2005/0285862 A1 | 12/2005 | Noda |
| 2006/0039227 A1 | 2/2006 | Lai et al. |
| 2006/0055434 A1 | 3/2006 | Tak et al. |
| 2006/0119443 A1 | 6/2006 | Azam et al. |
| 2006/0139105 A1 | 6/2006 | Maxim et al. |
| 2006/0143428 A1 | 6/2006 | Noda |
| 2006/0248305 A1 | 11/2006 | Fang |
| 2007/0001721 A1 | 1/2007 | Chen et al. |
| 2007/0047283 A1 | 3/2007 | Miyanishi |
| 2007/0058407 A1 | 3/2007 | Dosaka et al. |
| 2007/0109030 A1 | 5/2007 | Park |

(56) References Cited

U.S. PATENT DOCUMENTS

| | | |
|---|---|---|
| 2007/0115739 A1 | 5/2007 | Huang |
| 2007/0139997 A1 | 6/2007 | Suzuki |
| 2007/0171713 A1 | 7/2007 | Hunter |
| 2007/0189101 A1 | 8/2007 | Lambrache et al. |
| 2007/0229129 A1 | 10/2007 | Nakagawa |
| 2008/0010429 A1 | 1/2008 | Rao |
| 2008/0049484 A1 | 2/2008 | Sasaki |
| 2008/0068096 A1 | 3/2008 | Feng et al. |
| 2008/0079467 A1 | 4/2008 | Hou et al. |
| 2008/0080230 A1 | 4/2008 | Liaw |
| 2008/0117707 A1 | 5/2008 | Manickavasakam |
| 2008/0129402 A1 | 6/2008 | Han et al. |
| 2008/0155362 A1 | 6/2008 | Chang et al. |
| 2008/0175039 A1 | 7/2008 | Thomas |
| 2008/0181029 A1 | 7/2008 | Joshi et al. |
| 2008/0265957 A1 | 10/2008 | Luong et al. |
| 2008/0273361 A1 | 11/2008 | Dudeck et al. |
| 2009/0027947 A1 | 1/2009 | Takeda |
| 2009/0089646 A1 | 4/2009 | Hirose |
| 2009/0141566 A1 | 6/2009 | Arsovski |
| 2009/0154257 A1 | 6/2009 | Fukaishi et al. |
| 2009/0231943 A1 | 9/2009 | Kunce et al. |
| 2009/0256642 A1 | 10/2009 | Lesso |
| 2009/0296869 A1 | 12/2009 | Chao et al. |
| 2009/0319871 A1 | 12/2009 | Shirai et al. |
| 2010/0020590 A1 | 1/2010 | Hsueh et al. |
| 2010/0085086 A1 | 4/2010 | Nedovic et al. |
| 2010/0157715 A1 | 6/2010 | Pyeon |
| 2010/0169675 A1 | 7/2010 | Kajihara |
| 2010/0172190 A1 | 7/2010 | Lavi |
| 2010/0177571 A1 | 7/2010 | Shori et al. |
| 2010/0214815 A1 | 8/2010 | Tam |
| 2010/0232202 A1 | 9/2010 | Lu |
| 2010/0260001 A1 | 10/2010 | Kasprak et al. |
| 2010/0271138 A1 | 10/2010 | Thakur et al. |
| 2010/0322022 A1 | 12/2010 | Shinozaki et al. |
| 2011/0018597 A1 | 1/2011 | Lee et al. |
| 2011/0063898 A1 | 3/2011 | Ong |
| 2011/0153932 A1 | 6/2011 | Ware et al. |
| 2011/0211401 A1 | 9/2011 | Chan et al. |
| 2011/0267914 A1 | 11/2011 | Ishikura |
| 2011/0280307 A1 | 11/2011 | Macinnis et al. |
| 2011/0292743 A1 | 12/2011 | Zimmerman |
| 2011/0299353 A1 | 12/2011 | Ito et al. |
| 2012/0049911 A1 | 3/2012 | Ura |
| 2012/0133114 A1 | 5/2012 | Choi |
| 2012/0153999 A1 | 6/2012 | Kim |
| 2012/0242382 A1 | 9/2012 | Tsuchiya et al. |
| 2012/0243347 A1 | 9/2012 | Sampigethaya |
| 2012/0250440 A1 | 10/2012 | Wu |
| 2012/0281459 A1 | 11/2012 | Teman et al. |
| 2012/0327704 A1 | 12/2012 | Chan |
| 2013/0039131 A1 | 2/2013 | Haig et al. |
| 2013/0083591 A1 | 4/2013 | Wuu |
| 2013/0170289 A1 | 7/2013 | Grover et al. |
| 2014/0056093 A1 | 2/2014 | Tran et al. |
| 2014/0125390 A1 | 5/2014 | Ma |
| 2014/0136778 A1 | 5/2014 | Khailany et al. |
| 2014/0185366 A1 | 7/2014 | Chandwani et al. |
| 2014/0269019 A1 | 9/2014 | Kolar |
| 2015/0003148 A1 | 1/2015 | Iyer et al. |
| 2015/0029782 A1 | 1/2015 | Jung |
| 2015/0063052 A1 | 3/2015 | Manning |
| 2015/0187763 A1 | 7/2015 | Kim et al. |
| 2015/0213858 A1 | 7/2015 | Tao |
| 2015/0248927 A1 | 9/2015 | Fujiwara |
| 2015/0279453 A1 | 10/2015 | Fujiwars |
| 2015/0302917 A1 | 10/2015 | Grover |
| 2015/0310901 A1 | 10/2015 | Jung |
| 2015/0357028 A1 | 12/2015 | Huang et al. |
| 2016/0005458 A1 | 1/2016 | Shu et al. |
| 2016/0027500 A1 | 1/2016 | Chuang et al. |
| 2016/0064068 A1 | 3/2016 | Mojumder |
| 2016/0141023 A1 | 5/2016 | Jung |
| 2016/0225436 A1 | 8/2016 | Wang |
| 2016/0225437 A1 | 8/2016 | Kumar |
| 2016/0247559 A1 | 8/2016 | Atallah et al. |
| 2016/0284392 A1 | 9/2016 | Block et al. |
| 2016/0329092 A1 | 11/2016 | Akerib |
| 2017/0194046 A1 | 7/2017 | Yeung, Jr. et al. |
| 2017/0345505 A1 | 11/2017 | Noel et al. |
| 2018/0122456 A1 | 5/2018 | Li |
| 2018/0123603 A1 | 5/2018 | Chang |
| 2018/0157621 A1 | 6/2018 | Shu et al. |
| 2018/0158517 A1 | 6/2018 | Shu et al. |
| 2018/0158518 A1 | 6/2018 | Shu et al. |
| 2018/0158519 A1 | 6/2018 | Shu et al. |
| 2018/0158520 A1 | 6/2018 | Shu |
| 2020/0117398 A1 | 4/2020 | Haig et al. |
| 2020/0160905 A1 | 5/2020 | Charles et al. |
| 2020/0301707 A1 | 9/2020 | Shu et al. |

OTHER PUBLICATIONS

Wang et al., "A Two-Write and Two-Read Multi-Port SRAM with Shared Write Bit-Line Scheme and Selective Read Path for Low Power Operation", Journal of Low Power Electronics vol. 9. 9-22, 2013, Department of Electronics Engineering and Institute of Electronics, National Chiao-Tung University, Hsinchu 300, Taiwan (Received: Oct. 15, 2012: Accepted: Feb. 11, 2013), 14 pages.

\* cited by examiner

Section 0

Section 1

Section K

US 10,891,076 B1

RESULTS PROCESSING CIRCUITS AND METHODS ASSOCIATED WITH COMPUTATIONAL MEMORY CELLS

PRIORITY CLAIM/RELATED APPLICATIONS

This application is a continuation in part of and claims priority under 35 USC 120 to U.S. patent application Ser. No. 15/709,399, filed Sep. 19, 2017 and entitled "Computational Dual Port Sram Cell And Processing Array Device Using The Dual Port Sram Cells For Xor And Xnor Computations", U.S. patent application Ser. No. 15/709,401, filed Sep. 19, 2017 and entitled "Computational Dual Port Sram Cell And Processing Array Device Using The Dual Port Sram Cells For Xor And Xnor Computations", U.S. patent application Ser. No. 15/709,379, filed Sep. 19, 2017 and entitled "Computational Dual Port Sram Cell And Processing Array Device Using The Dual Port Sram Cells", U.S. patent application Ser. No. 15/709,382, filed Sep. 19, 2017 and entitled "Computational Dual Port Sram Cell And Processing Array Device Using The Dual Port Sram Cells", and U.S. patent application Ser. No. 15/709,385, filed Sep. 19, 2017 and entitled "Computational Dual Port Sram Cell And Processing Array Device Using The Dual Port Sram Cells" that in turn claim priority under 35 USC 119(e) and 120 and claim the benefit of U.S. Provisional Patent Application No. 62/430,767, filed Dec. 6, 2016 and entitled "Computational Dual Port Sram Cell And Processing Array Device Using The Dual Port Sram Cells For Xor And Xnor Computations" and U.S. Provisional Patent Application No. 62/430,762, filed Dec. 6, 2016 and entitled "Computational Dual Port Sram Cell And Processing Array Device Using The Dual Port Sram Cells", the entirety of all of which are incorporated herein by reference.

FIELD

The disclosure relates generally to a computational memory element and in particular to a computational memory element array having results processing circuitry.

BACKGROUND

Memory cells have traditionally been used to store bits of data. It is also possible to architect a memory cell so that the memory cell is able to perform some simple logical functions when multiple memory cells are connected to the same read bit line. For example, when memory cells A, B, and C are connected to a particular read bit line and are read simultaneously, and the memory cells and read bit line circuitry are designed to produce a logical AND result, then the result that appears on the read bit line is AND (a,b,c) (i.e. "a AND b AND c"), where a, b, and c represent the binary data values stored in memory cells A, B, and C respectively. More particularly, in these computational memory cells, the read bit line is pre-charged to a logic "1" before each read operation, and the activation of one or more read enable signals to one or more memory cells discharges the read bit line to a logic "0" if the data stored in any one or more of those memory cells="0"; otherwise, the read bit line remains a logic "1" (i.e. in its pre-charge state). In this way, the read bit line result is the logical AND of the data stored in those memory cells. The memory cells may be subdivided into a plurality of sections and each section may have a plurality of bit line sections that perform a logical function and their logical functions, may be used to execute a wide variety of computational algorithms.

Typically, all bit line sections in a section execute the same computational algorithm on their respective data because the bit line sections share the same read and write control signals. Oftentimes, it is desirable to be able to combine the results across multiple bit line sections to generate a single result for those multiple bit line sections. For example, if the algorithm is designed to search for a particular data pattern within the data stored in the bit line sections, it is desirable to know if any of the one or more of the bit line sections contain that data pattern. It is to this end that this disclosure is directed.

DETAILED DESCRIPTION OF ONE OR MORE EMBODIMENTS

The disclosure is particularly applicable to a processing array, semiconductor memory or computer that utilizes a plurality of computational memory cells (with each cell being formed with a static random access memory (SRAM) cell) and additional response (RSP) circuitry to provide a mechanism to logically combine the computation results across multiple bit line sections in a section and across multiple sections, and transmit the combined result as an output of the processing array and/or store the combined result into one or more of those multiple bit line sections. It will be appreciated, however, that each computational memory cell may be other types of volatile and non-volatile memory cell that are within the scope of the disclosure, that other additional circuitry (including more, less or different logic) may be used and are within the scope of the disclosure or that different computational memory cell architectures or that those disclosed below are within the scope of the disclosure.

The disclosure is directed to a memory/processing array that has a plurality of computing memory cells in an array with additional RSP circuitry. Each computing memory cell in a column in the array may have a read bit line and the read bit line for each of the computing memory cells in the column may be tied together as a single read bit line. The memory/processing array may be subdivided into one or more sections (an example of which is shown in FIGS. 3B and 3C) wherein each section has a unique set of "n" bit lines (each bit line being part of a bit line section) where each bit line section (bl-sect) comprises a single read bit line and a pair of positive and negative write bit lines, with each bit line connected to "m" computational memory cells. Each bit line section also may have a read data storage that is used to capture and store the read result from the read bit line during read operations (so a read data storage is implemented per read bit line) and read circuitry for routing the read data or the selected write data for performing logical operations. In the disclosure, BL-Sect[x,y] is a shorthand notation indicating a bit line section with bit line "y" in section "x" and "bl-sect" means bit line section.

Figure 1:
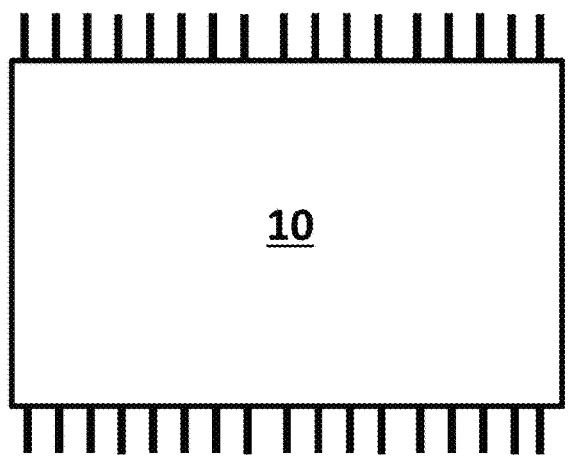
FIG. 1 illustrates an example of a semiconductor memory that may include a plurality of computation memory cells and RSP circuitry.
Figure 2:
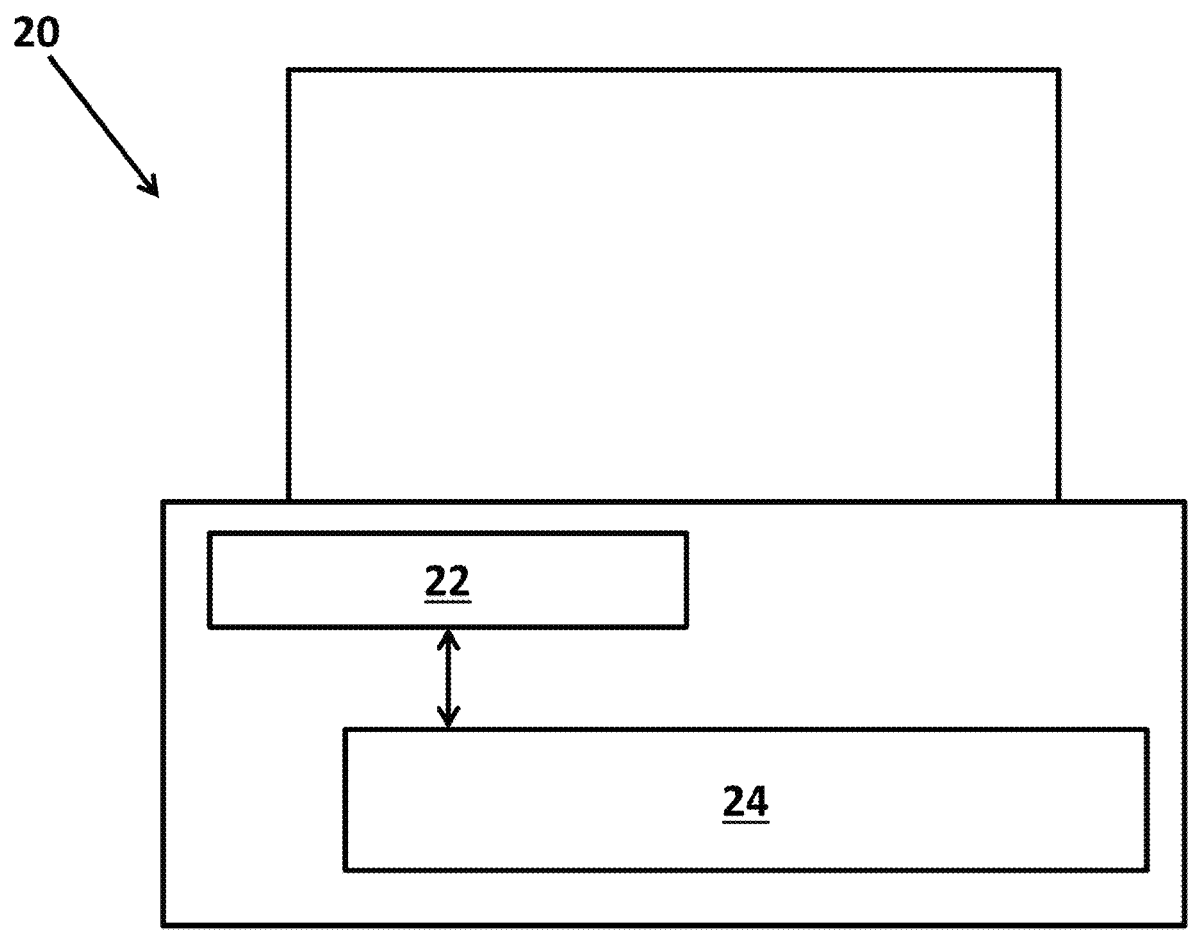
FIG. 2 illustrates an example of a computer system that may include a plurality of computation memory cells and RSP circuitry.

FIG. 1 illustrates an example of a semiconductor memory 10 that may include a plurality of computation memory cells and circuitry that provides an RSP capability that is described below in more detail. The below disclosed plurality of computation memory cells and RSP circuitry allow the semiconductor memory 10 to logically combine computation results across bit line sections of the plurality of computation memory cells. FIG. 2 illustrates an example of a computer system 20 that may include a plurality of computation memory cells and the RSP circuitry that are described below in more detail. The below disclosed plurality of computation memory cells and RSP circuitry allow the semiconductor memory 10 or computer system 20 and memory 24 to logically combine computation results across bit line sections of the plurality of computation memory cells. The computer system 20 in FIG. 2 may have at least one processor 22 and a memory 24 that may include the plurality of computation memory cells and read circuitry for selecting read or write data.

Figure 3A:
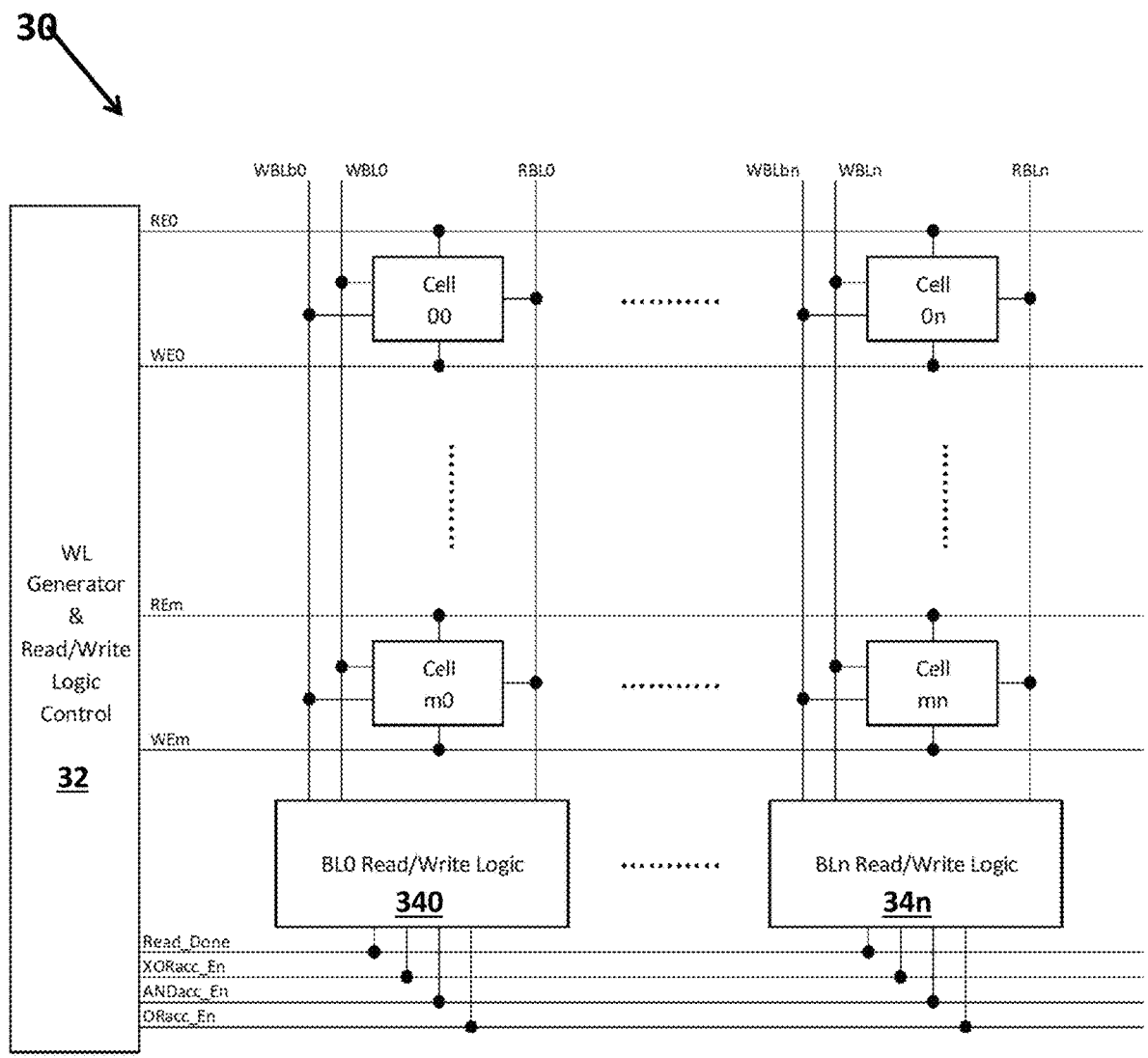
FIG. 3A illustrates an example of a processing array with computational memory cells that may be incorporated into a semiconductor memory or computer system.
Figure 3B:
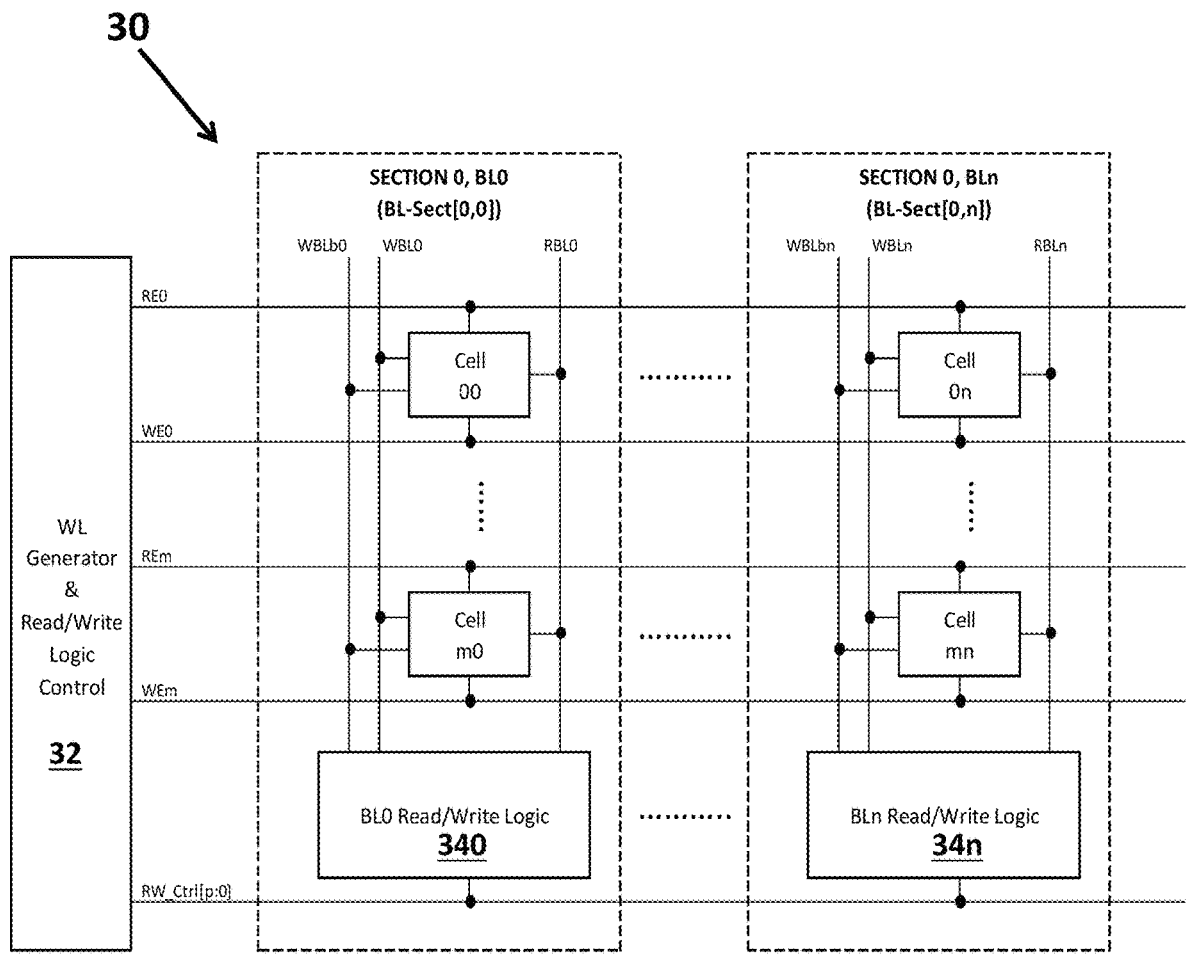
FIG. 3B illustrates the processing array with computational memory cells having one section and multiple bit line sections.
Figure 3C:
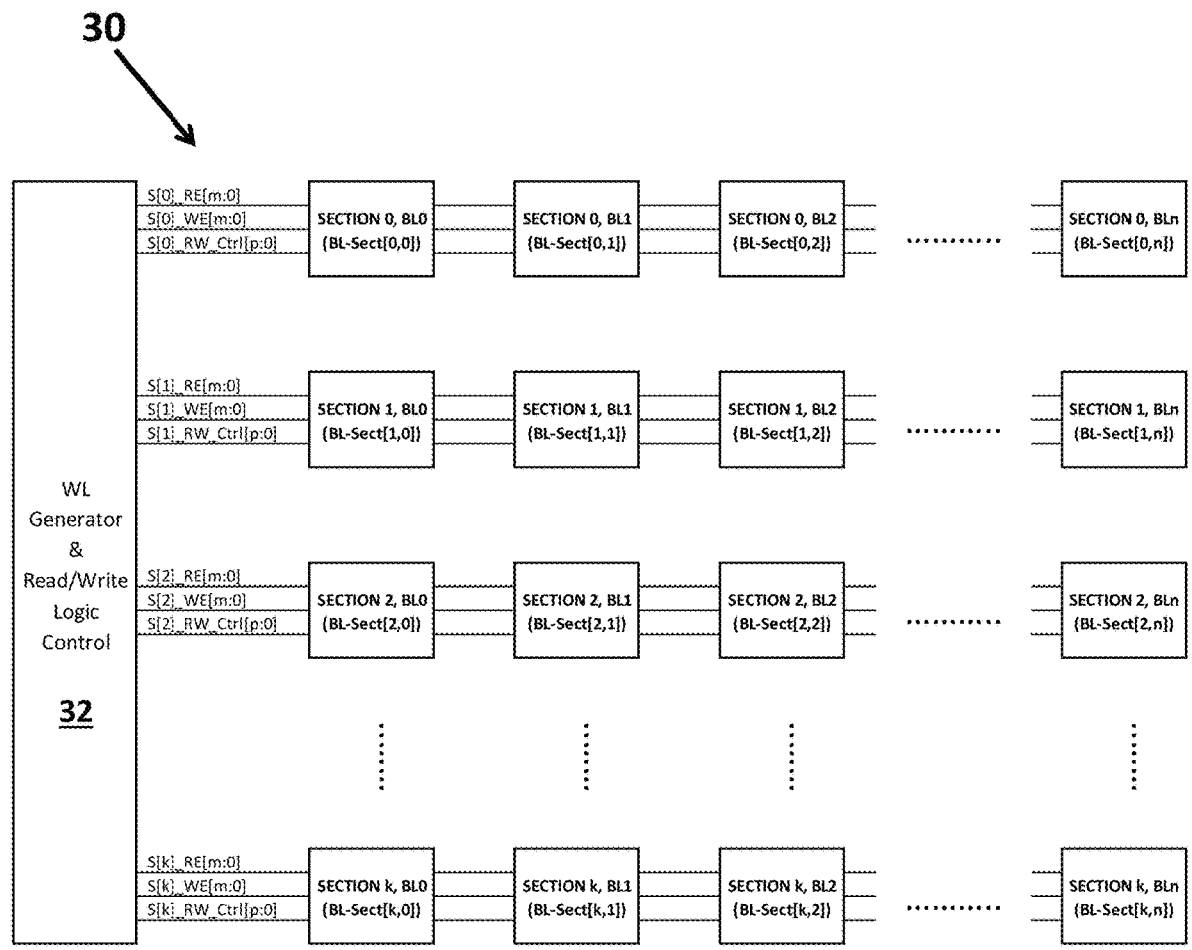
FIG. 3C illustrates the processing array with computational memory cells having multiple sections and multiple bit line sections.

FIG. 3A illustrates an example of a processing array 30 with computational memory cells in an array that may be incorporated into a semiconductor memory or computer system and may include RSP circuitry. The processing array 30 may include an array of computational memory cells (cell 00, . . . , cell 0n and cell m0, . . . , cell mn). In one embodiment, the array of computational memory cells may be rectangular as shown in FIG. 3A and may have a plurality of columns and a plurality of rows wherein the computational memory cells in a particular column may also be connected to the same read bit line (RBL0, . . . , RBLn). The processing array 30 may further include a wordline (WL) generator and read/write logic control circuit 32 that may be connected to and generate signals for the read word line (RE) and write word line (WE) for each memory cell (such as RE0, . . . , REn and WE0, . . . , WEn) to control the read and write operations is well known and one or more read/write circuitry 34 that are connected to the read and write bit lines of the computational memory cells. In the embodiment shown in FIG. 3A, the processing array may have read/write circuitry 34 for each set of bit line signals of the computational memory cells (e.g., for each column of the computational memory cells whose read bit lines are connected to each other). For example, BL0 read/write logic 340 may be coupled to the read and write bit lines (WBLb0, WBL0 and RBL0) for the computational memory cells in column 0 of the array and BLn read/write logic 34n may be coupled to the read and write bit lines (WBLbn, WBLn and RBLn) for the computational memory cells in column n of the array as shown in FIG. 3A.

The wordline (WL) generator and read/write logic control circuit 32 may also generate one or more control signals that control each read/write circuitry 34. For example, for the different embodiments of the read/write logic described in the co-pending U.S. patent application Ser. No. 16/111,178 filed Aug. 23, 2018 and entitled "Read Data Processing Circuits and Methods Associated with Computational Memory Cells" and incorporated herein by reference, the one or more control signals may include a Read_Done control signal, an XORacc_En control signal, an ANDacc_En control signal and an ORacc_En control signal whose operation and details are described in the above incorporated by reference application. Note that for each different embodiment, a different one or more of the control signals is used so that the wordline (WL) generator and read/write logic control circuit 32 may generate different control signals for each embodiment or the wordline (WL) generator and read/write logic control circuit 32 may generate each of the control signals, but then only certain of the control signals or all of the control signals may be utilized as described in the above incorporated by reference co-pending patent application.

During a read operation, the wordline (WL) generator and read/write logic control circuit 32 may activate one or more word lines that activate one or more computational memory cells so that the read bit lines of those one or more computational memory cells may be read out. Further details of the read operation are not provided here since the read operation is well known.

FIGS. 3B and 3C illustrate the processing array 30 with computational memory cells having sections having the same elements as shown in FIG. 3A. The array 30 in FIG.

3B has one section (Section 0) with "n" bit lines (bit line 0 (BL0), . . . , bit line n (BLn)) in different bit line sections (bl-sect), where each bit line connects to "m" computational memory cells (cell 00, . . . , cell m0 for bit line 0, for example). In the example in FIG. 3B, the m cells may be the plurality of computational memory cells that are part of each column of the array 30. FIG. 3C illustrates the processing array 30 with computational memory cells having multiple sections. In the example in FIG. 3C, the processing array device 30 comprises "k" sections with "n" bit lines each, where each bit line within each section connects to "m" computational memory cells. Note that the other elements of the processing array 30 are present in FIG. 3C, but not shown for clarity. In FIG. 3C, the BL-Sect(0,0) block shown corresponds to the BL-Sect(0,0) shown in FIG. 3B with the plurality of computational memory cells and the read/write logic 340 and each other block shown in FIG. 3C corresponds to a separate portion of the processing array. As shown in FIG. 3C, the set of control signals, generated by the wordline generator and read/write logic controller 32, for each section may include one or more read enable control signals (for example S[0] RE[m:0] for section 0), one or more write enable control signals (for example S[0]_WE [m:0] for section 0) and one or more read/write control signals (for example S[0]_RW_Ctrl[p:0] for section 0). As shown in FIG. 3C, the array 30 may have a plurality of sections (0, . . . , k in the example in FIG. 3C) and each section may have multiple bit line sections (0, . . . , n per section, in the example in FIG. 3C).

Figure 4A:
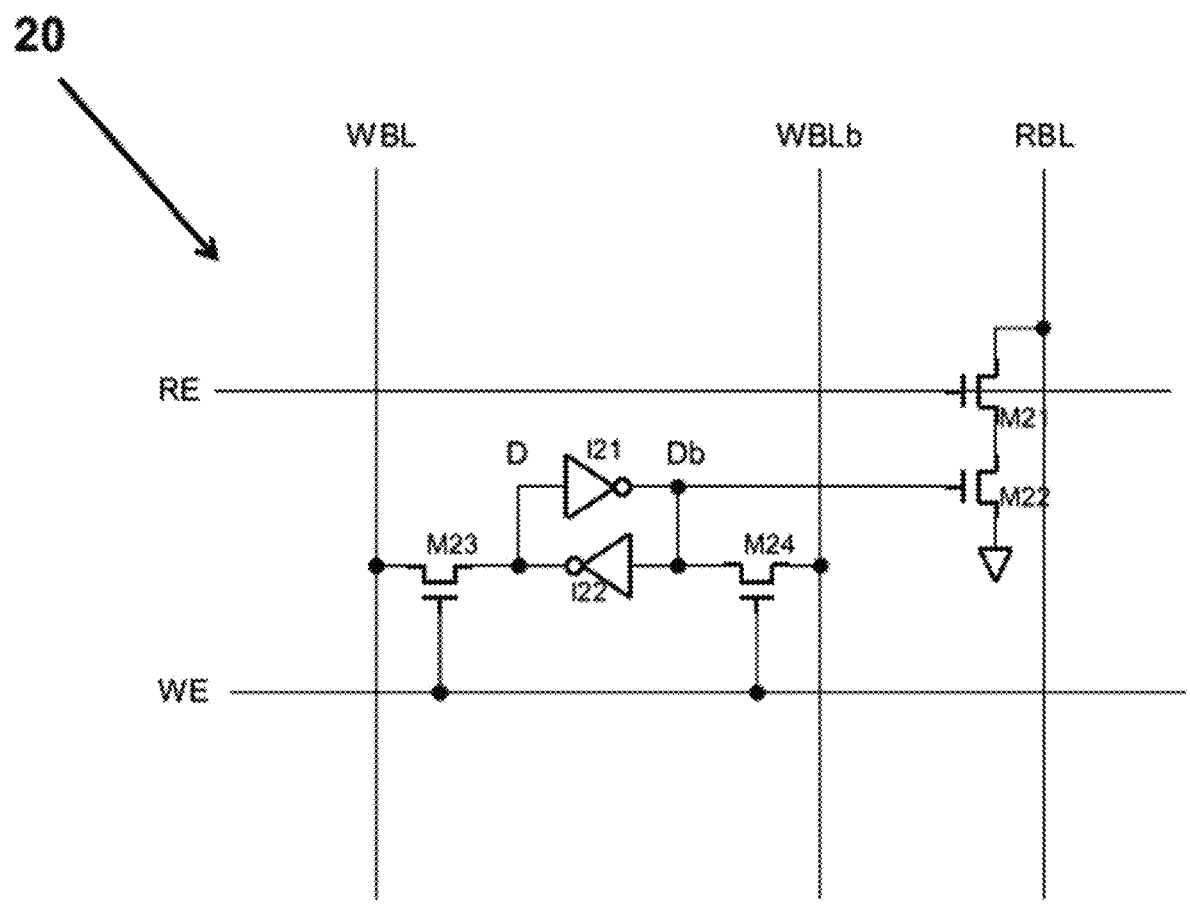
FIGS. 4A and 4B illustrate examples of two different types of computational memory cells that may be used in the semiconductor memory of FIG. 1, the computer system of FIG. 2 or the processing array of FIGS. 3A-3C.
Figure 4B:
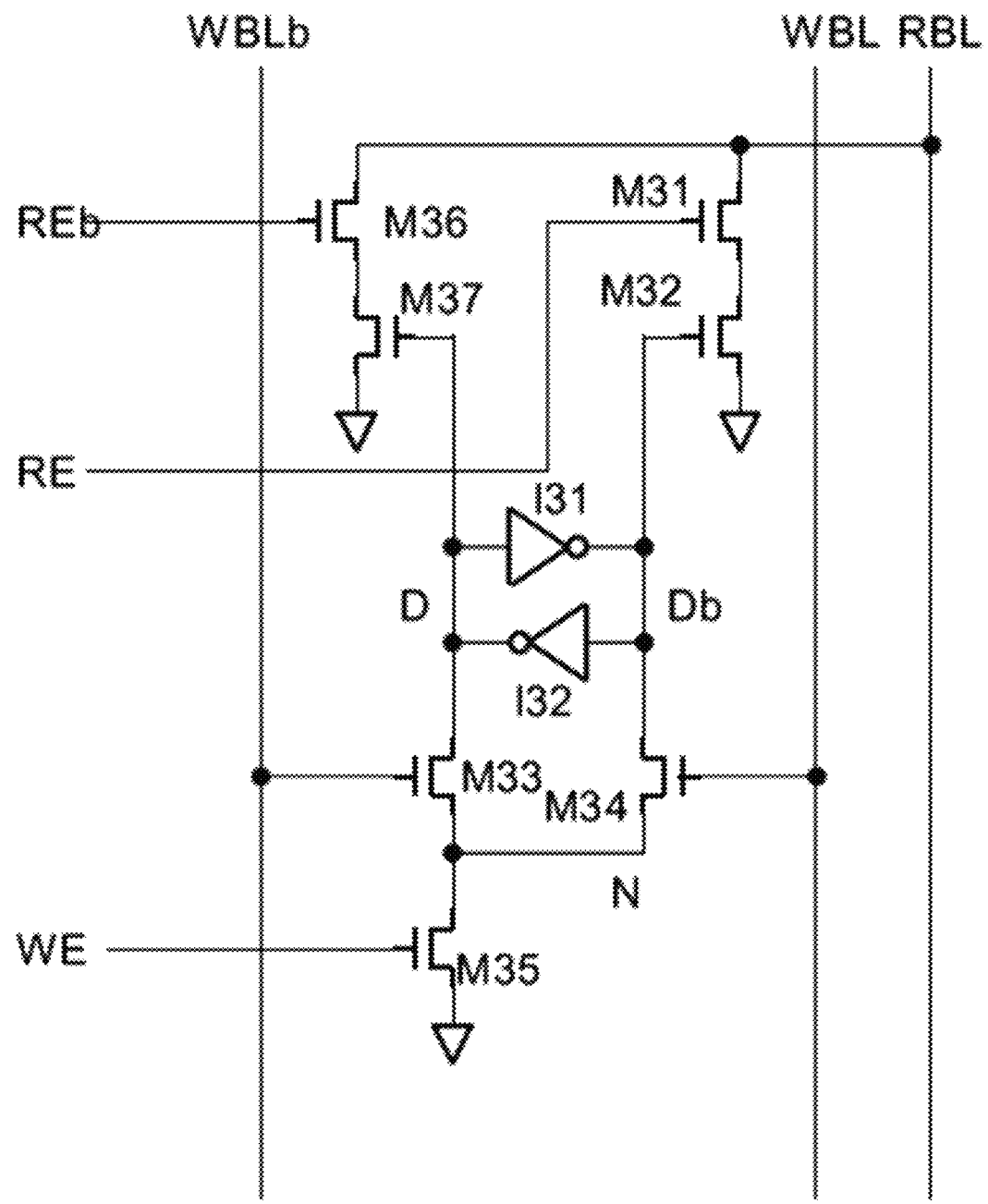

FIGS. 4A and 4B illustrate examples of two different types of computational memory cells that may be used in the semiconductor memory of FIG. 1, the computer system of FIG. 2 or the processing array of FIGS. 3A-C. In the examples, the computational memory cell are based on an SRAM memory cell.

FIG. 4A illustrates an example of a dual port SRAM cell 20 that may be used for computation. The dual port SRAM cell may include two cross coupled inverters 121, 122 and two access transistors M23 and M24 that interconnected together to form a 6T SRAM cell. The SRAM may be operated as storage latch and may have a write port. The two inverters are cross coupled since the input of the first inverter is connected to the output of the second inverter and the output of the first inverter is coupled to the input of the second inverter as shown in FIG. 4A. A Write Word line carries a signal and is called WE and a write bit line and its complement are called WBL and WBLb, respectively. The Write word line WE is coupled to the gates of the two access transistors M23, M24 that are part of the SRAM cell. The write bit line and its complement (WBL and WBLb) are each coupled to one side of the respective access transistors M23, M24 as shown in FIG. 4A while the other side of each of those access transistors M23, M24 are coupled to each side of the cross coupled inverters (labeled D and Db in FIG. 4A.)

The circuit in FIG. 4A may also have a read word line RE, a read bit line RBL and a read port formed by transistors M21, M22 coupled together to form as isolation circuit as shown. The read word line RE may be coupled to the gate of transistor M21 that forms part of the read port while the read bit line is coupled to the source terminal of transistor M21. The gate of transistor M22 may be coupled to the Db output from the cross coupled inverters 121, 122.

During reading, multiple cells (with only a single cell being shown in FIG. 4A) can turn on to perform an AND function. Specifically, at the beginning of the read cycle, RBL is pre-charged high and if the Db signal of all cells that are turned on by RE is "0", then RBL stays high since, although the gate of transistor M21 is turned on by the RE signal, the gate of M22 is not turned on and the RBL line is not connected to the ground to which the drain of transistor M22 is connected. If the Db signal of any or all of the cells is "1" then RBL is discharged to 0 since the gate of M22 is turned on and the RBL line is connected to ground. As a result, RBL=NOR (Db0, Db1, etc.) where Db0, Db1, etc. are the complementary data of the SRAM cells that have been turned on by the RE signal. Alternatively, RBL=NOR (Db0, Db1, etc.)=AND (D0, D1, etc.), where D0, D1, etc. are the true data of the cells that have been turned on by the RE signal.

As shown in FIG. 4A, the Db signal of the cell 20 may be coupled to a gate of transistor M22 to drive the RBL. However, unlike the typical 6T cell, the Db signal is isolated from the RBL line and its signal/voltage level by the transistors M21, M22. Because the Db signal/value is isolated from the RBL line and signal/voltage level, the Db signal is not susceptive to the lower bit line level caused by multiple "0" data stored in multiple cells in contrast to the typical SRAM cell. Therefore, for the cell in FIG. 4A, there is no limitation of how many cells can be turned on to drive RBL. As a result, the cell (and the device made up for multiple cells) offers more operands for the AND function since there is no limit of how many cells can be turned on to drive RBL. Furthermore, in the cell in FIG. 4A, the RBL line is pre-charged (not a static pull up transistor as with the typical 6T cell) so this cell can provide much faster sensing because the current generated by the cell is all be used to discharge the bit line capacitance with no current being consumed by a static pull up transistor so that the bit line discharging rate can be faster by more than 2 times. The sensing for the disclosed cell is also lower power without the extra current consumed by a static pull up transistor and the discharging current is reduced by more than half.

The write port of the cell in FIG. 4A is operated in the same manner as the 6T typical SRAM cell. As a result, the write cycle and Selective Write cycle for the cell have the same limitation as the typical 6T cell. In addition to the AND function described above, the SRAM cell 20 in FIG. 4A also may perform a NOR function by storing inverted data. Specifically, if D is stored at the gate of M22, instead of Db, then RBL=NOR (D0, D1, etc.). One skilled in the art understand that the cell configuration shown in FIG. 4A would be slightly altered to achieve this, but that modification is within the scope of the disclosure. Further details of this exemplary computational memory cell is found in co-pending U.S. patent application Ser. Nos. 15/709,379, 15/709,382 and 15/709,385 all filed on Sep. 19, 2017 and entitled "Computational Dual Port Sram Cell And Processing Array Device Using The Dual Port Sram Cells" which are incorporated herein by reference.

FIG. 4B illustrates an implementation of a dual port SRAM cell 100 with an XOR function. The dual port SRAM cell 100 may include two cross coupled inverters 131, 132 and two access transistors M33 and M34 that are interconnected together as shown in FIG. 4B to form the basic SRAM cell. The SRAM may be operated as storage latch and may have a write port. The two inverters 131, 132 are cross coupled since the input of the first inverter is connected to the output of the second inverter (labeled D) and the output of the first inverter (labeled Db) is coupled to the input of the second inverter as shown in FIG. 4B. The cross coupled inverters 131, 132 form the latch of the SRAM cell. The access transistor M33 and M34 may have their respective gates connected to write bit line and its complement (WBL, WBLb) respectively. A Write Word line carries a signal WE. The Write word line WE is coupled to the gate of a transistor M35 that is part of the access circuitry for the SRAM cell.

The circuit in FIG. 4B may also have a read word line RE, a read bit line RBL and a read port formed by transistors M31, M32 coupled together to form as isolation circuit as shown. The read word line RE may be coupled to the gate of transistor M31 that forms part of the read port while the read bit line RBL is coupled to the drain terminal of transistor M31. The gate of transistor M32 may be coupled to the Db output from the cross coupled inverters 131, 132. The isolation circuit isolates the latch output Db (in the example in FIG. 4B) from the read bit line and signal/voltage level so that the Db signal is not susceptive to the lower bit line level caused by multiple "0" data stored in multiple cells in contrast to the typical SRAM cell.

The cell 100 may further include two more read word line transistors M36, M37 and one extra complementary read word line, REb. When the read port is active, either RE or REb is high and the REb signal/voltage level is the complement of RE signal/voltage level. RBL is pre-charged high, and if one of (M31, M32) or (M36, M37) series transistors is on, RBL is discharged to 0. If none of (M31, M32) or (M36, M37) series transistors is on, then RBL stay high as 1 since it was precharged high. The following equation below, where D is the data stored in the cell and Db is the complement data stored in the cell, describes the functioning/operation of the cell:

$$RBL=AND(NAND(RE,Db),NAND(REb,D))=XNOR(RE,D) \quad (EQ1)$$

If the word size is 8, then it needs to be stored in 8 cells (with one cell being shown in FIG. 4B) on the same bit line. On a search operation, an 8 bit search key can be entered using the RE, REb lines of eight cells to compare the search key with cell data. If the search key bit is 1, then the corresponding RE=1 and REb=0 for that cell. If the search key bit is 0, then the corresponding RE=0 and REb=1. If all 8 bits match the search key, then RBL will be equal to 1. IF any 1 of the 8 bits is not matched, then RBL will be discharged and be 0. Therefore, this cell 100 (when used with 7 other cells for an 8 bit search key) can perform the same XNOR function but uses half the number of cell as the typical SRAM cell. The following equation for the multiple bits on the bit line may describe the operation of the cells as:

$$RBL=AND(XNOR(RE1,D1),XNOR(RE2,D2), \ldots ,XNOR(REi,Di)), \text{ where } i \text{ is the number of active cell.} \quad (EQ2)$$

By controlling either RE or REb to be a high signal/on, the circuit 100 may also be used to do logic operations mixing true and complement data as shown below:

$$RBL=AND(D1,D2, \ldots ,Dn,Dbn+1,Dbn+2, \ldots Dbm) \quad (EQ3)$$

where D1, D2, ... Dn are "n" number of data with RE on and Dbn+1, Dbn+2, ... Dbm are m-n number of data with REb on.

Furthermore, if the cell 100 stores inverse data, meaning WBL and WBLb shown in FIG. 4B is swapped, then the logic equation EQ1 becomes XOR function and logic equation EQ3 becomes NOR a function and can be expressed as EQ 4 and EQ5

$$RBL=XOR(RE,D) \quad (EQ4)$$

$$RBL=NOR(D1,D2, \ldots ,Dn,Dbn+1,Dbn+2, \ldots Dbm) \quad (EQ5)$$

where D1, D2, ... Dn are n number of data with RE on and Dbn+1, Dbn+2, ... Dbm are m-n number of data with REb on.

In another embodiment, the read port of the circuit 100 is FIG. 4B may be reconfigured differently to achieve different Boolean equation. Specifically, transistors M31, M32, M36 and M37 may be changed to PMOS and the source of M32 and M37 is VDD instead of VSS, the bit line is pre-charged to 0 instead of 1 and the word line RE active state is 0. In this embodiment, the logic equations EQ1 is inverted so that RBL is an XOR function of RE and D (EQ6). EQ3 is rewritten as an OR function (EQ7) as follows:

$$RBL=XOR(RE,D) \quad (EQ6)$$

$$RBL=OR(D1,D2, \ldots ,Dn,Dbn+1,Dbn+2, \ldots Dbm) \quad (EQ7)$$

where D1, D2, ... Dn are n number of data with RE on and Dbn+1, Dbn+2, ... Dbm are m-n number of data with REb on.

If the cell stores the inverse data of the above discussed PMOS read port, meaning WBL and WBLb is swapped, then $$RBL=XNOR(RE,D) \quad (EQ8)$$

$$RBL=NAND(D1,D2, \ldots ,Dn,Dbn+1,Dbn+2, \ldots Dbm) \quad (EQ9)$$

where D1, D2, ... Dn are n number of data with RE on and Dbn+1, Dbn+2, ... Dbm are m-n number of data with REb on.

For example, consider a search operation where a digital word needs to be found in a memory array in which the memory array can be configured as each bit of the word stored on the same bit line. To compare 1 bit of the word, then the data is stored in a cell and its RE is the search key, then EQ1 can be written as below:

$$RBL=XNOR(Key,D) \quad EQ10$$

If Key=D, then RBL=1. If the word size is 8 bits as D[0:7], then the search key Key[0:7] is its RE, then EQ2 can be expressed as search result and be written as below:

$$RBL=AND(XNOR(Key[0],D[0]),XNOR(Key[1],D[1]), \ldots ,Key[7],D[7]) \quad EQ11$$

If all Key[i] is equal to D[i] where i=0-7, then the search result RBL is match. Any one of Key[i] is not equal to D[i], then the search result is not match. Parallel search can be performed in 1 operation by arranging multiple data words along the same word line and on parallel bit lines with each word on 1 bit line. Further details of this computation memory cell may be found in U.S. patent application Ser. Nos. 15/709,399 and 15/709,401 both filed on Sep. 19, 2017 and entitled "Computational Dual Port Sram Cell And Processing Array Device Using The Dual Port Sram Cells For Xor And Xnor Computations", which are incorporated herein by reference.

Figure 5:
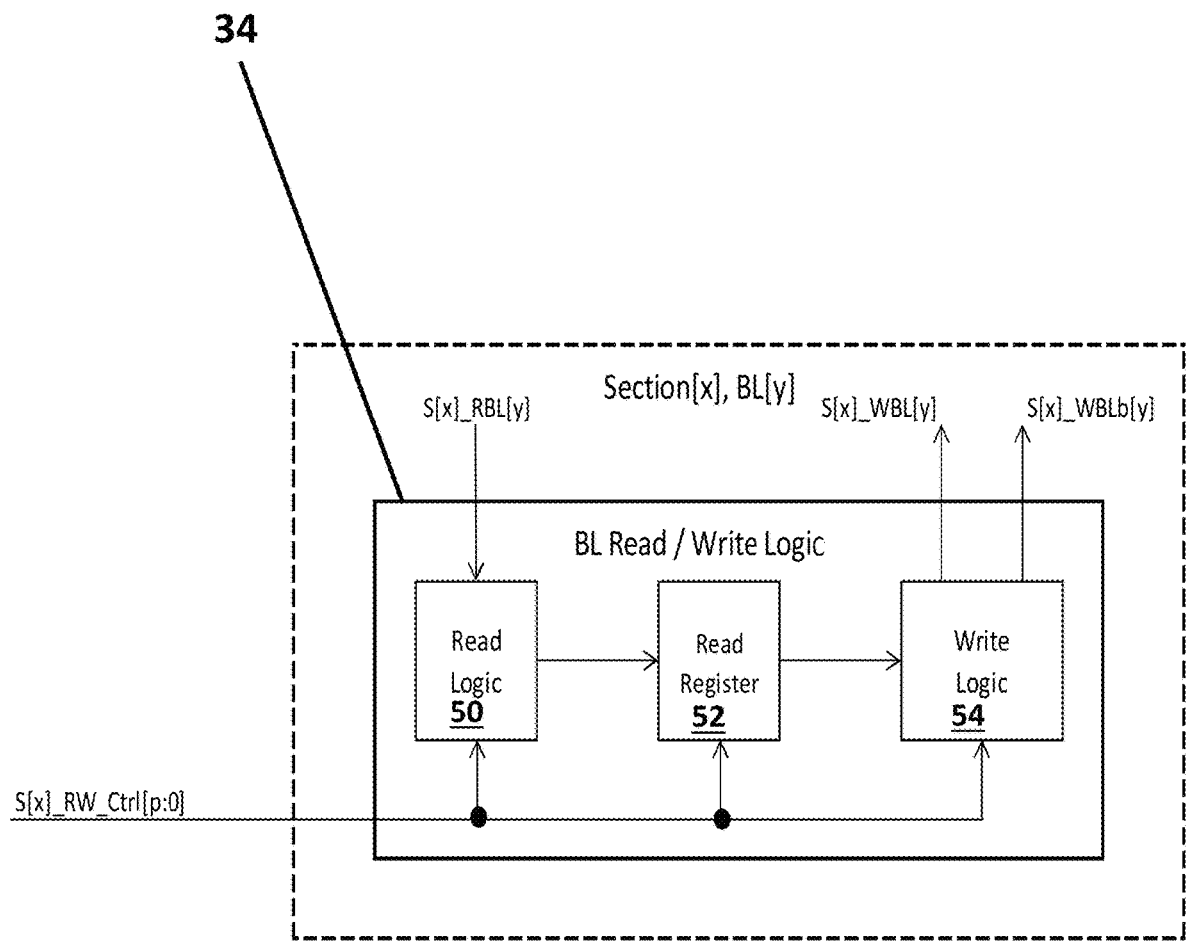
FIG. 5 illustrates read/write logic including read logic, read data storage, and write logic associated with each bit line section in the processing array device depicted in FIG. 3C.

FIG. 5 illustrates more details of the read/write circuitry 34 including read logic, read data storage, and write logic for each bl-sect in the processing array device depicted in FIG. 3C. The read/write circuitry 34 for each bit line section may include read circuitry 50, a read storage 52, implemented as a register, and write circuitry 54. The read/write circuitry 34 may also implement one embodiment of the RSP circuitry as described below. The read circuitry 50 and read storage 52 allows the data on the read bit lines connected to the particular read circuitry and read storage to accumulate so that more complex Boolean logic operations may be performed. Various implementations of the read circuitry 50 and read storage 52 may be found in Ser. No. 16/111,178 filed Aug. 23, 2018 and entitled "Read Data Processing Circuits and Methods Associated with Computational Memory Cells" that is co-pending and co-owned and is incorporated herein by reference. The write circuitry 54 manages the writing of data from each section. Each of the read circuitry 50, read storage 52 and write circuitry 54 may be connected to one or more control signals (S[x]_RW_Ctrl [p:0] in the example implementation shown in FIG. 5) that control the operation of each of the circuits. The control signals may include the read control signals that are described above in the incorporated by reference patent application.

The read circuitry 50 may receive inputs from the read bit line of the computing memory cells of the section (S[x]_RBL[y]) and the write circuitry 54 may receive an input from the read data storage 52 and output data to the write bit lines of the computing memory cells of the section (S[x]_WBL[y] and S[x]_WBLb[y] in the example in FIG. 5).

First Embodiment of RSP Circuitry

One way to provide a mechanism to logically combine the computation results across multiple bl-sects in a section, where each bl-sect produces a computation result that is ultimately captured in its Read Register 52, is to:

Implement an RSP data line (S[x]_RSP for example) that spans all bl-sects in the section.

Utilize additional circuitry in the bl-sects to produce a pre-defined logical function—in particular, a logical OR—on the RSP data line of the computation results captured in all bl-sect Read Registers in the section. That is, when the section has "n" bl-sects, to produce on the RSP data line the function:

RBL[0]_Reg_Out OR RBL[1]_Reg_Out OR . . . RBL[*n*−1]_Reg_Out

A logical OR is chosen because a common use case of RSP functionality is to determine if the algorithm (e.g. a search algorithm) produced a result="1" (e.g. indicating a positive match on the search data) in any one or more of the bl-sects in the section. In the embodiments below, each of the RSP logic circuits, control logic may be implemented using known circuits including Boolean logic circuits.

One way to produce the logical OR on the RSP data line is to define its default state as "0", and enable (by default) a pull-down transistor on the RSP data line to pull it to its "0" default state. Then when RSP functionality is engaged, temporarily and unconditionally disable the pull-down transistor on the RSP data line, and temporarily enable a pull-up transistor—one per bl-sect—on the RSP data line if the computation result captured in its associated bl-sect Read Register="1". In that way, the RSP data line remains in its "0" default state only if the computation result captured in all bl-sect Read Registers is "0"; otherwise, the RSP data line is pulled to "1", thereby producing a logical OR of all bl-sect Read Register states on the RSP data line.

Functionally, this scheme only requires one pull-down transistor on the RSP data line. However, several pull-down transistors (controlled by the same control signal) may be implemented on the RSP data line if needed (e.g. to decrease the amount of time required to discharge the RSP data line to "0").

Furthermore, additional RSP circuitry is implemented in each bl-sect such that the logical OR result produced on the RSP data line can be stored in a computational memory cell in the bl-sect.

And furthermore, additional RSP circuitry is implemented in the section such that the logical OR result produced on the RSP data line is driven to circuitry outside the processing array.

Figure 6:
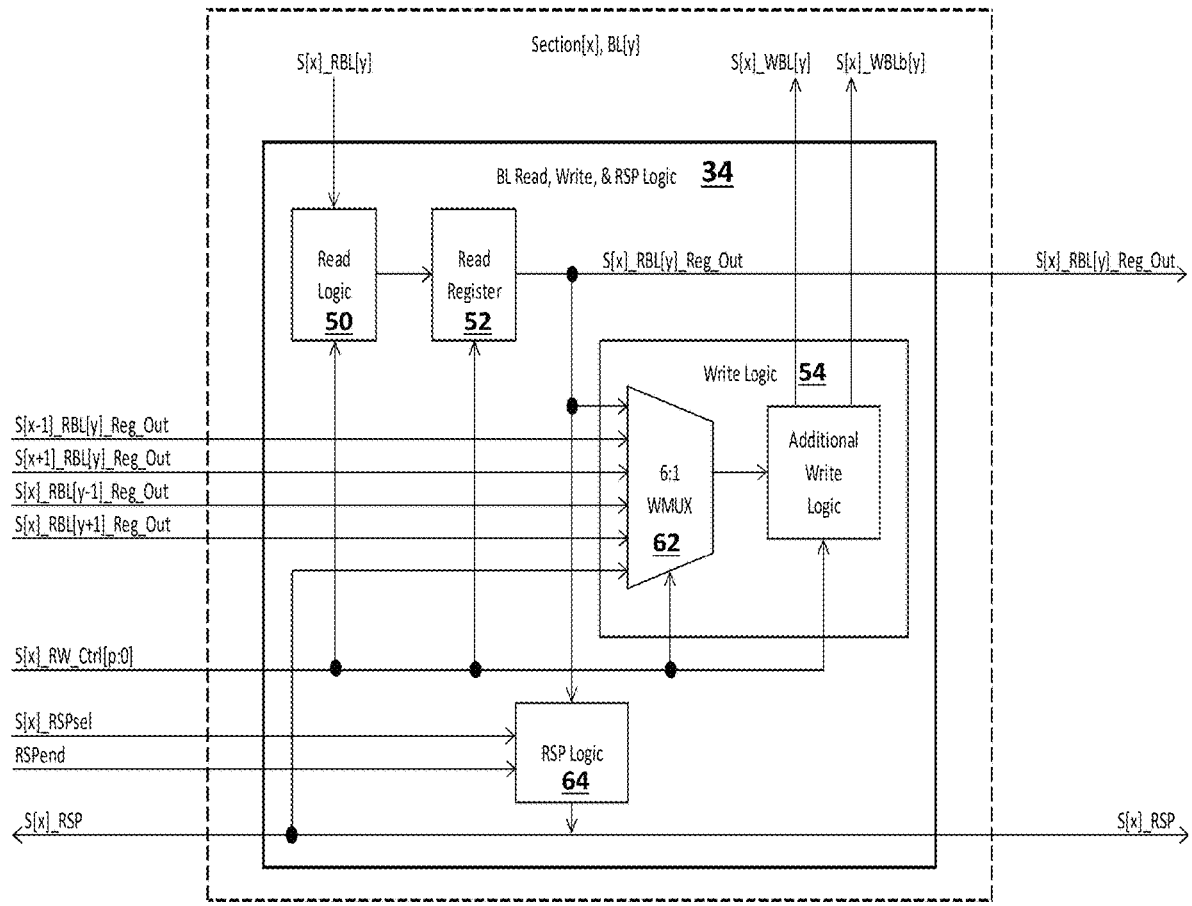
FIG. 6 illustrates the read/write logic that includes a results processing (RSP) data line and RSP circuitry in each bit line section that is used to produce combined computational results across all bit line sections on the RSP data line.

FIG. 6 illustrates the read/write logic 34 that includes a results processing (RSP) data line and RSP circuitry in each bit line section that is used to produce combined computational results across all bit line sections on the RSP data line. The read/write logic 34 has the same read logic 50 and read register 52 as the circuitry in FIG. 5 that operates in the same manner. As shown in FIG. 6, the write logic 54 may further have a write multiplexer 62, such as a 6:1 multiplexer) that selects, based on the RW_Ctrl[p:0] control signal, the data to be written into the memory cells for this bit line section wherein the data is selected from the read register 52 output (S[x]_RBL[y]_Reg_Out signal for example) as well as the read register output data from the neighboring bit line sections (S[x−1]_RBL[y]_Reg_Out, S[x+1]_RBL[y]_Reg_Out, S[x]_RBL[y−1]_Reg_Out and S[x]_RBL[y+1]_Reg_Out).

For the RSP circuitry, the read/write circuitry 34 may further include RSP Logic 64 that is used to produce the combined computation result on the RSP data line using the "n" bl-sect Read Register outputs as the data sources. In addition, the RSP data line data may be input to the write MUX 62 as shown that provides the ability to store the logic state of the RSP data line in a bl-sect memory cell. The RSP logic is controlled by the RSPsel and RSPend control signals (generated by the read/write logic control 32 in FIG. 3A) and has an output that drives the RSP data line.

Figure 7:
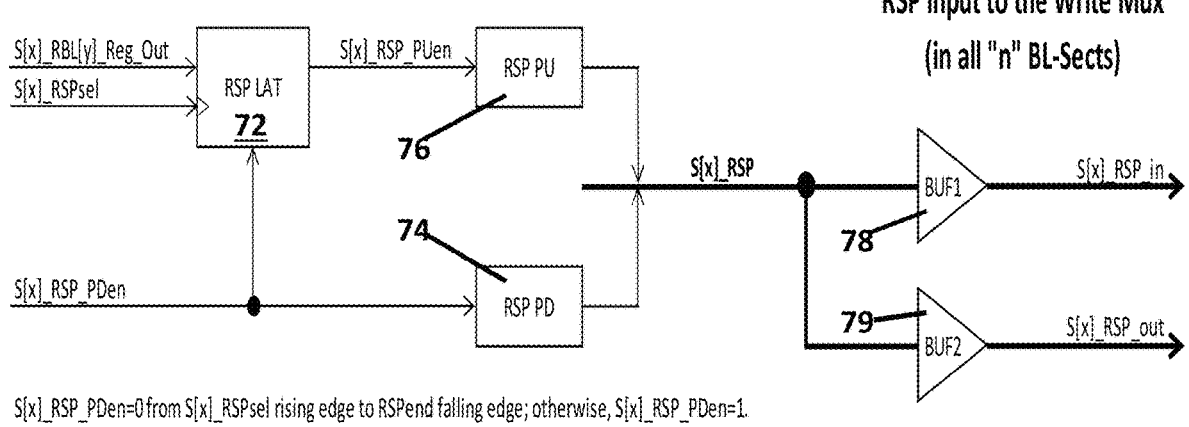
FIG. 7 illustrates a single bit line section with the RSP circuitry including RSP logic that produces the combined computational results on the RSP line and an additional line to the write multiplexer that provides the ability to store the logic state of the RSP data line.

FIG. 7 illustrates a single bit line section with the RSP circuitry 70 including RSP logic that produces the combined computational results on the RSP line and an additional line to the write multiplexer that provides the ability to store the logic state of the RSP data line. The circuitry may include a pull down enable signal (S[x]_RSP_PDen for example) control signal that defaults to "1", and is only "0" from the rising edge of the RSPsel control signal to the falling edge of the RSPend control signal. The circuitry may further include a latch 72 (RSP latch) whose data input is the "RBL_Reg_Out" output (S[x]_RBL[y]_Reg_out for example) of the Read Register 52 of the bit line section, whose clock input is the RSPsel control signal, whose reset input is the RSP_PDen control signal, and whose data output is an RSP Pull-Up Enable ("RSP_PUen") control signal. The functionality of RSP LAT 72 is such that when RSP_PDen=1, then RSP_PUen=0; when RSP_PDen=0 and RSPsel=1, then RSP_PUen=RBL_Reg_Out; otherwise, RSP_PUen remains unchanged. In the depicted implementation, there is one RSP LAT per bit line section.

The RSP circuitry 70 may further include an RSP Pull-Down Transistor 74 ("RSP PD") implemented on the RSP data line, whose enable input is the RSP_PDen control signal. In the depicted implementation, there is one RSP PD per bl-sect. The circuitry 70 may further include an RSP Pull-Up Transistor 76 ("RSP PU") implemented on the RSP data line, whose enable input is the RSP_PUen control signal. In the depicted implementation, there is one RSP PU per bl-sect. The circuitry 70 may further include a first Buffer 78 ("BUF1") whose input is the RSP data line, and whose output "RSP_in" is driven to the bl-sect Write Mux shown in FIG. 6. In the depicted implementation, there is one such buffer per bl-sect. The circuitry 70 may further include a second Buffer 79 ("BUF2") whose input is the RSP data line, and whose output "RSP_out" is driven out of the processing array. In the depicted implementation, there is one such buffer for the entire section.

Figure 8:
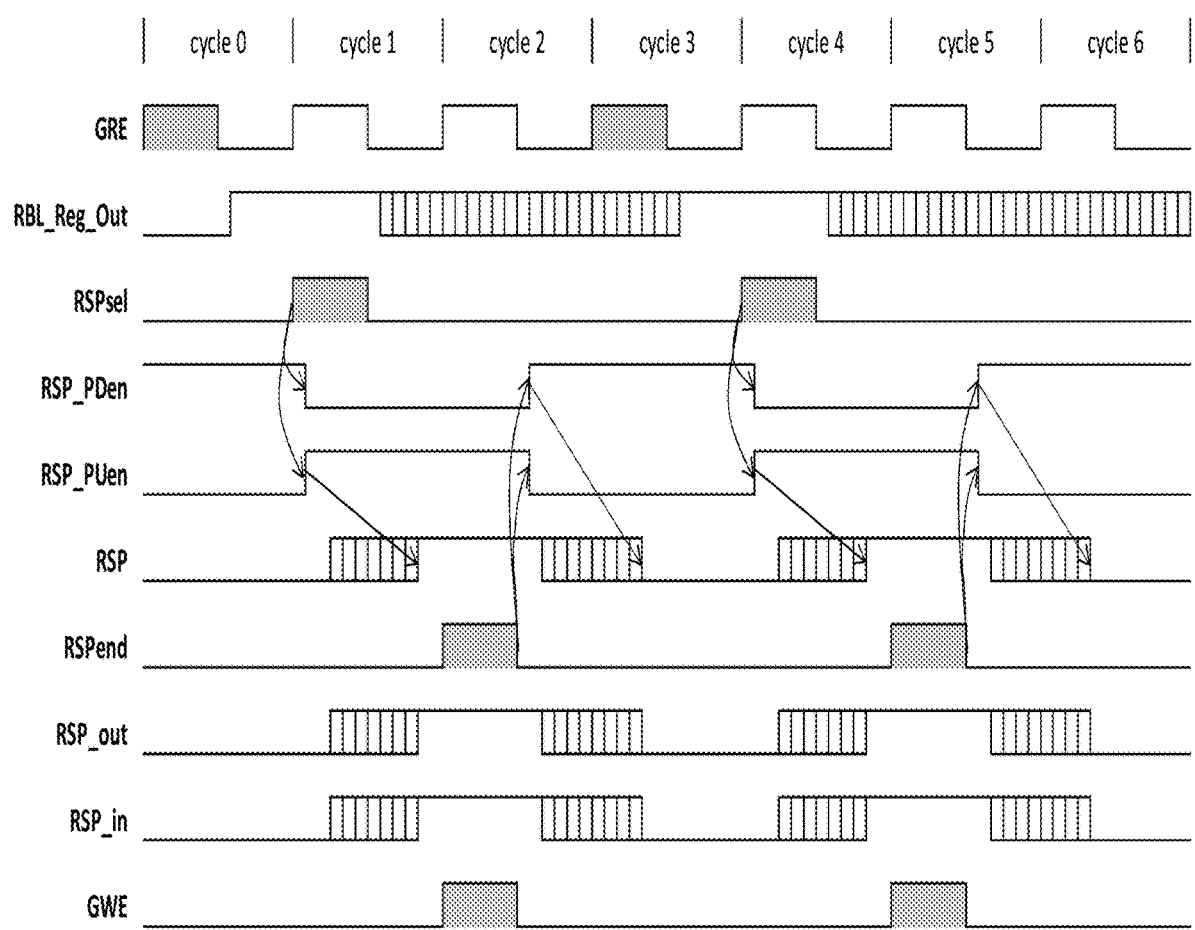
FIG. 8 illustrates an example of the signal timing associated with the RSP logic shown in FIG. 7.

FIG. 8 illustrates an example of the signal timing associated with the RSP logic shown in FIG. 7 when RSP is engaged to store the RSP result in the bl-sect and to drive the RSP result out of the processing array.
1. In cycle 0, GRE is asserted to "1" for a half-cycle to initiate a read operation that causes a computation result="1" to be captured in the bl-sect Read Register. In this cycle, RSP_PDen="1" (its default state), thereby causing RSP_PUen="0" (its default state), thereby causing the RSP data line="0" (its default state).
2. In cycle 1, RSPsel is asserted to "1" for a half-cycle to engage RSP functionality. The rising edge of RSPsel causes RSP_PDen="0", and RSPsel=1 causes RSP LAT to capture the RBL_Reg_Out output of the Read Register (i.e. the logic "1" from cycle 0), thereby causing RSP_PUen="1", thereby causing the RSP data line="1".
3. In cycle 2, RSPend is asserted to "1" for a half-cycle to disengage RSP functionality. The falling edge of RSPend causes RSP_PDen="1", thereby causing RSP_PUen="0", thereby causing the RSP data line="0" (back to its default state).
4. Simultaneously with the assertion of RSPend, GWE is asserted to "1" for a half-cycle to initiate a write operation that stores the state of the RSP data line in a computational memory cell in the bl-sect. Note that the assertion of GWE unnecessary if the sole objective of the RSP engagement is to use the RSP result outside the processing array.

The timing diagram illustrates the minimum delay required between the assertion of RSPsel and the assertions of RSPend and GWE. If needed, this delay can be increased without affecting the depicted RSP functionality.

The RSP implementation in FIG. 7 allows for an RSP read operation (i.e. a read operation that generates a computation result in the bl-sect Read Register that is subsequently used for RSP engagement) to be initiated as often as every 3 cycles. The RSP implementation in FIG. 7 allows for a non-RSP read operation (i.e. a read operation that generates a computation result in the bl-sect Read Register that is not subsequently used for RSP engagement) to be initiated in any cycle(s) after an RSP read operation is initiated, without affecting the RSP result associated with that RSP read operation.

Figure 9:
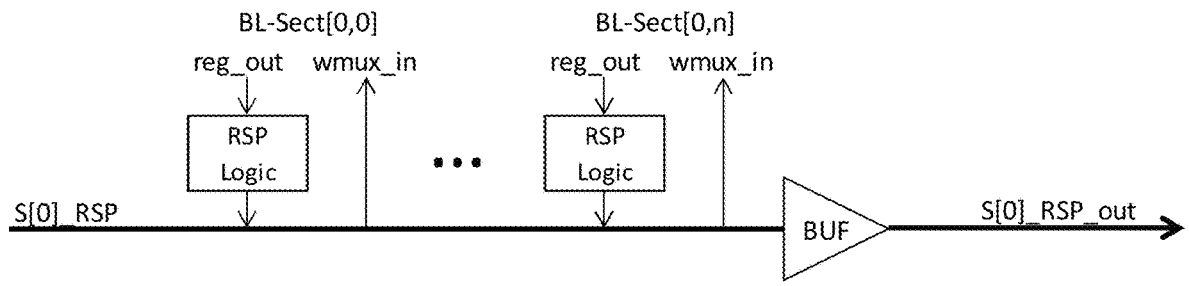
FIG. 9 illustrates high level RSP functionality when "K" sections with "n" bit lines in the processing array including the generation of the RSP result from each section.
Figure 9:
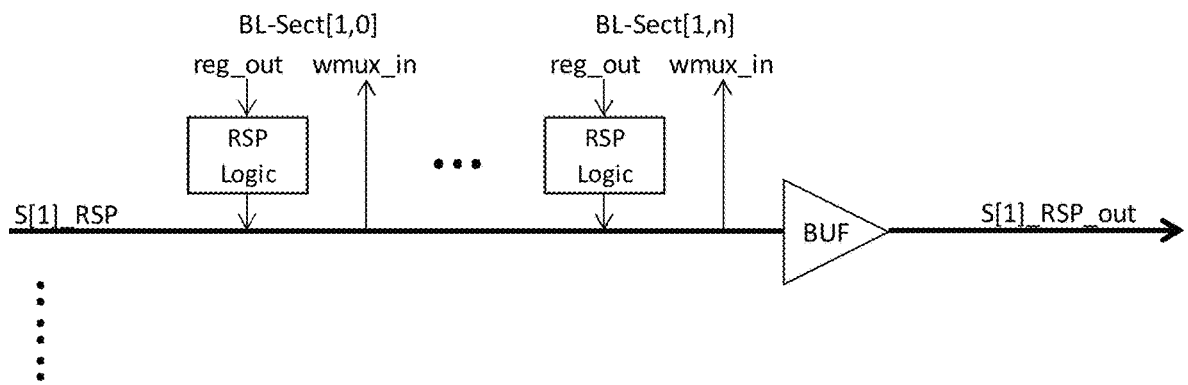
Figure 9:
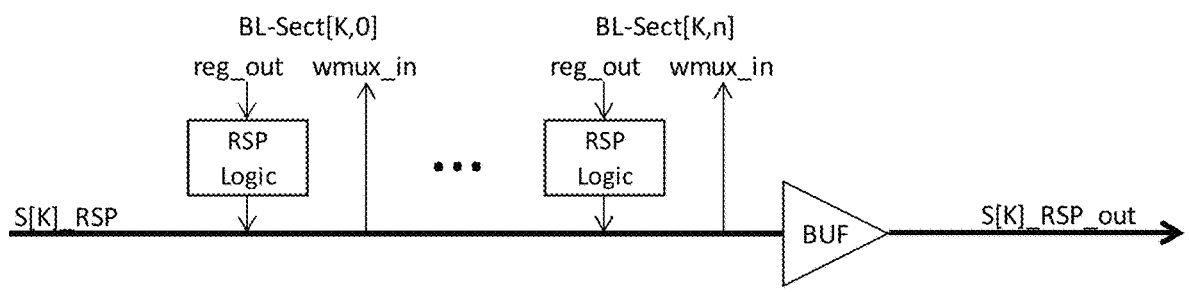

FIG. 9 illustrates high level RSP functionality for a processing array having "K" sections (Section 0, Section 1, . . . , Section K) with each section having "n" bit line sections (BL-Sect[0,0], . . . , BL-Sect[0,n], etc.) with "n" bit lines in the processing array. As shown in FIG. 9, each section of the processing array has RSP circuitry and logic in each bit line section and a buffer that generate the RSP result (S[0]_RSP_out, etc.) from each section.

Second Embodiment of RSP Circuitry

Figure 10:
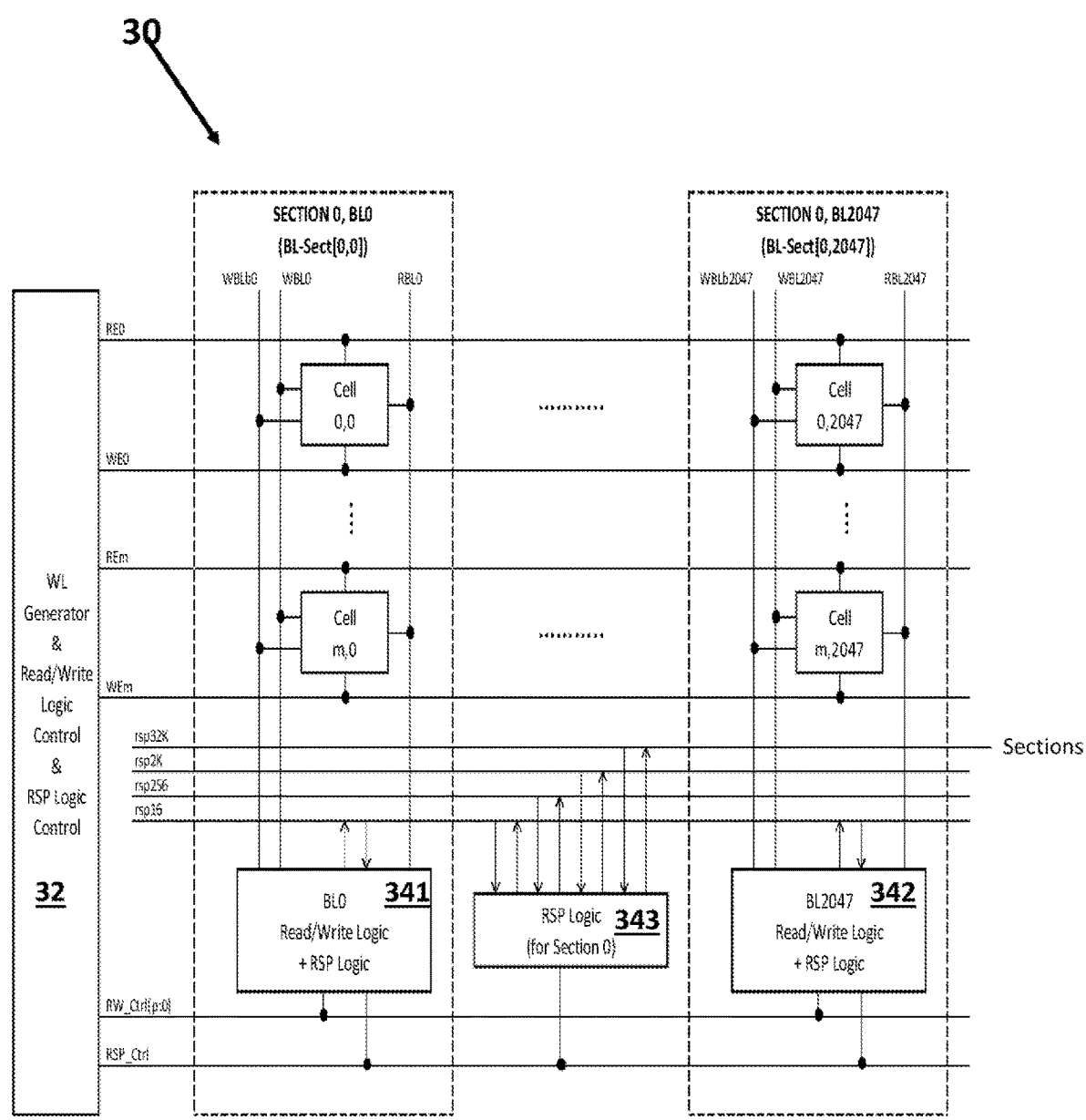
FIG. 10 illustrates a processing array with 2048 bit lines and four RSP data lines.

In a second embodiment, a mechanism to logically combine the computation results across multiple bit line sections (bl-sects) in a section and across multiple sections where each bl-sect produces a computation result that is ultimately captured in its Read Register is provided. The circuitry for the second embodiment may include:
A set of "s" RSP data lines (an example of which is shown in FIG. 10) that, in stages, span an increasing number of bl-sects, where the stage 1 through stage "s-2" RSP data lines span a subset of bl-sects in a section, the stage "s-1" RSP data line spans all bl-sects in a section, and the stage "s" RSP data line spans all bl-sects across multiple sections.

The generation of outbound RSP functionality from the stage 1 RSP data line to the stage "s" RSP data line, as follows:
Utilize additional circuitry in the bl-sects to produce a logical OR on each stage 1 RSP data line of the computation results captured in the bl-sect Read Registers spanned by each stage 1 RSP data line.
Utilize additional circuitry in the section to produce a logical OR on each stage 2 RSP data line of the states of the multiple stage 1 RSP data lines spanned by each stage 2 RSP data line.
Utilize additional circuitry in the section to produce a logical OR on each additional stage RSP data line from the stage 3 RSP data line to the stage "s-1" RSP data line (e.g., perform this for each successive stage RSP data line).
Utilize additional circuitry in each section to produce a logical OR on the stage "s" RSP data line of the states of the multiple stage "s-1" RSP data lines spanned by the stage "s" RSP data line.

One way to produce the logical OR on each RSP data line during the outbound flow is (as was done in the first embodiment) to define their default states as "0", and enable (by default) pull-down transistor(s) to pull each RSP data line to its "0" default state. Then, when RSP functionality is engaged:
At the first stage of the outbound RSP flow, temporarily and unconditionally disable the pull-down transistor(s) on the stage 1 RSP data line, and temporarily enable a pull-up transistor—one per bl-sect—if the computation result captured in the bl-sect Read Register="1".
At the second stage of the outbound RSP flow, temporarily and unconditionally disable the pull-down transistor(s) on the stage 2 RSP data line, and temporarily enable a pull-up transistor—one per stage 1 RSP data line—if the state of the stage 1 RSP data line="1".
At the last stage of the outbound RSP flow, temporarily and unconditionally disable the pull-down transistor(s) on the stage "s" RSP data line, and temporarily enable a pull-up transistor—one per stage "s-1" RSP data line—if the state of the stage "s-1" RSP data line="1".

The implementation is such that the outbound RSP flow can be halted at any RSP stage before the inbound RSP flow (see below) is engaged to return the OR result from the RSP stage at which the outbound RSP flow was halted back to all stage 1 RSP data lines, and from there store it in the bl-sects. In this way any RSP stage result, from stage 1 to stage "s", can be stored in the bl-sects.

The generation of inbound RSP functionality from the stage "s" RSP data line to the stage "1" RSP data line, as follows:
Utilize additional circuitry in each section to enable the state of the stage "s" RSP data line, if ="1", onto all stage "s-1" RSP data lines spanned by the stage "s" RSP data line. Note that the state of the stage "s" RSP data line can only be "1" if the outbound flow is engaged all the way to stage "s".
Utilize additional circuitry in the section to enable the state of each stage "s-1" RSP data line, if ="1, onto all stage "s-2" RSP data lines spanned by each stage "s-1" RSP data line. Note that the state of the stage "s-1" RSP data line can only be "1" if the outbound flow is engaged to stage "s-1" or further.
Utilize additional circuitry in the section to enable the state of each stage 2 RSP data line, if ="1", onto all stage 1 RSP data lines spanned by each stage 2 RSP data line. Note that the state of the stage 2 RSP data line can only be "1" if the outbound flow is engaged to stage 2 or further.

The purpose of the inbound RSP functionality is to return the OR result from the RSP stage at which the outbound RSP flow is halted back to the stage 1 RSP data lines, and from there store it in the bl-sects. The inbound RSP flow is only engaged when the objective of an RSP engagement includes storing the RSP result in the bl-sects. If the sole objective of an RSP engagement is to use the RSP result outside the processing array, then the outbound RSP flow is engaged to stage "s" and the inbound RSP flow is not engaged.

When the inbound RSP flow is engaged after the outbound RSP flow is halted at stage "r", where 1<r<=s, one way to return the OR result from the stage "r" RSP data line to the stage "1" RSP data line is to:

- Enable a pull-up transistor on each stage "s-1" RSP data line if the state of the stage "s" RSP data line that spans it="1" (which is only possible if r=s).
- Enable a pull-up transistor on each stage "s-2" RSP data line if the state of the stage "s-1" RSP data line that spans it="1" (which is only possible if r>=s-1).
- Enable a pull-up transistor on each stage 1 RSP data line if the state of the stage 2 RSP data line that spans it="1" (which is only possible if r>=2).

These pull-up transistors are enabled long enough for the stage "r" RSP data line state, if "1", to propagate back to the multiple stage 1 RSP data lines spanned by the stage "r" RSP data line.

If the outbound RSP flow is halted at the stage 1 RSP data line (i.e. r=1), then the inbound RSP flow is still engaged as part of the process to store the result in the bl-sects even though, in this case, no return propagation from a latter RSP stage is involved.

Furthermore, additional RSP circuitry is implemented in each bl-sect such that the logical OR result produced on the stage 1 RSP data line can be stored in a computational memory cell in the bl-sect. Additional RSP circuitry is also implemented in each section such that the logical OR result produced on each stage "s-1" RSP data line (spanning an entire section) is driven to circuitry outside the processing array. Additional RSP circuitry is also implemented such that the logical OR result produced on the single stage "s" RSP data line (spanning multiple sections) is driven to circuitry outside the processing array.

FIG. 10 illustrates a processing array 30 with 2048 bit lines (and cells 0,0, . . . , cell m,2047), 2K bit line sections (BL-Sect[0,0], . . . , BL-Sect[0,2047]) and four RSP data lines including rsp16 (stage 1), rsp256 (stage 2), rsp2K (stage 3), and rsp32K (stage 4). FIG. 10 shows that each bit line section has its read/write logic with RSP circuitry 341, 342 connected to one of the RSP data lines and each section has RSP logic 343 connected to all of the RSP lines. All of the read/write logic and RSP circuits are also connected to the control signals (RW_Ctrl[p:0] and RSP Ctrl) generated by the controller 32 of the processing array 30. The RSP circuitry in each bl-sect (341, 342 in the example in FIG. 10) is used to produce a combined computation result across groups of 16 bl-sects on each of the 128 rsp16 data lines in the section. The RSP circuitry 343 in each section is used to: 1) produce a combined computation result across groups of 256 bl-sects on each of the 8 rsp256 data lines in the section; 2) produce a combined computation result across all 2K bl-sects on the rsp2K data line in the section; and 3) produce a combined computation result across 32K bl-sects in 16 sections on the rsp32K data line associated with those 16 sections.

Figure 11:
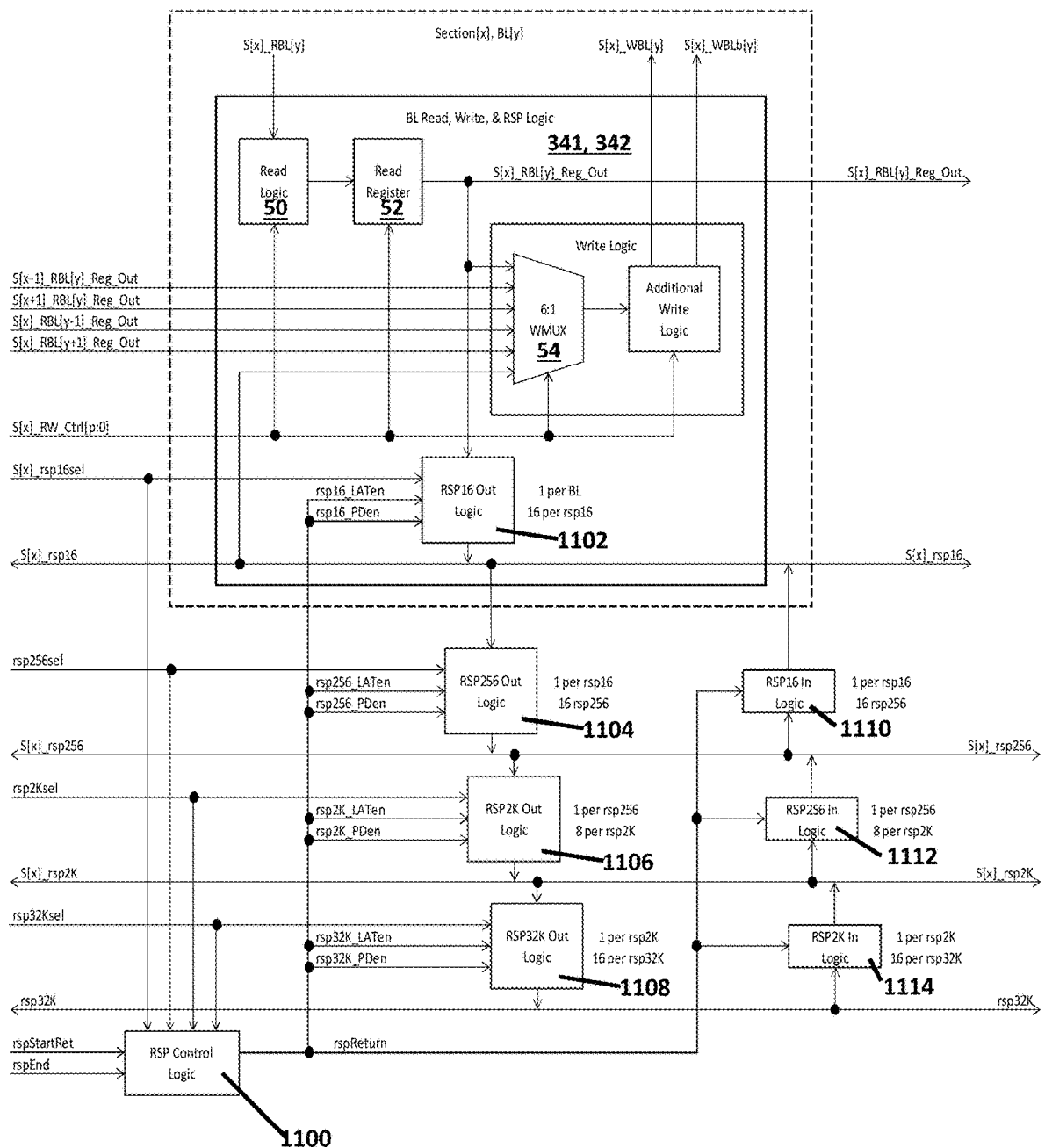
FIG. 11 illustrates a single bit line section from the processing array in FIG. 10.

FIG. 11 illustrates a single bit line section (Section[x], BL[y] in this example) from the processing array 30 in FIG. 10 that has the same read logic 50, read register 52 and write multiplexer 54 as described above that operates in the same way as described above. In addition to the circuitry in the bit line section, FIG. 11 also shows RSP circuitry outside the bl-sect. As shown in FIG. 11, the group of sixteen sections in the computation memory has RSP Control Logic circuitry 1100. In particular, blocks 1100 and 1104-1114 shown in FIG. 1 are implemented outside of the bl-sect. For the RSP out logic and the RSP in logic (1104-1114), there are multiple circuits per rspXXX data line. For example, there is one 1104 block and one 1110 block per rsp16 data line, as noted immediately to the right of those blocks; since each rsp16 data line spans 16 bl-sects which means there are one of these particular blocks per 16 bl-sects.

The RSP control logic 1100 has inputs that are rsp16sel, rsp256sel, rsp2Ksel, rsp32Ksel, rspStartRet, and rspEnd control signals that are generated by the control logic 32 of the processing array 30 described above, and whose outputs are rsp16_LATen, rsp16_PDen, rsp256_LATen, rsp256_PDen, rsp2K_LATen, rsp2K_PDen, rsp32K_LATen, rsp32K_PDen, and rspReturn control signals that control the RSP output circuits and logic and RSP input circuits and logic for the bit line section as shown in FIG. 11.

The logic illustrated in FIG. 11 may further comprise:

- RSP16 Out Logic 1102 whose inputs are the output of the bl-sect Read Register, rsp16sel, rsp16 LATen, and rsp16 PDen as control signals, and whose output drives the rsp16 data line (S[x]_rsp16).
- RSP256 Out Logic 1104 whose inputs are the rsp16 data line, rsp256sel, rsp256_LATen, and rsp256_PDen control signals, and whose output drives the rsp256 data line.
- RSP2K Out Logic 1106 whose inputs are the rsp256 data line, rsp2Ksel, rsp2K_LATen, and rsp2K_PDen control signals, and whose output drives the rsp2K data line.
- RSP32K Out Logic 1108 whose inputs are the rsp2K data line, rsp32Ksel, rsp32K_LATen, and rsp32K_PDen control signals, and whose output drives the rsp32K data line.
- RSP2K In Logic 1114 whose inputs are the rsp32K data line and rspReturn control signal, and whose output drives the rsp2K data line.
- RSP256 In Logic 1112 whose inputs are the rsp2K data line and rspReturn control signal, and whose output drives the rsp256 data line.
- RSP16 In Logic 1110 whose inputs are the rsp256 data line and rspReturn control signal, and whose output drives the rsp16 data line.
- The 6:1 Write Mux 54 in the bl_sect whose 6$^{th}$ input is the rsp16 data line.

Figure 12:
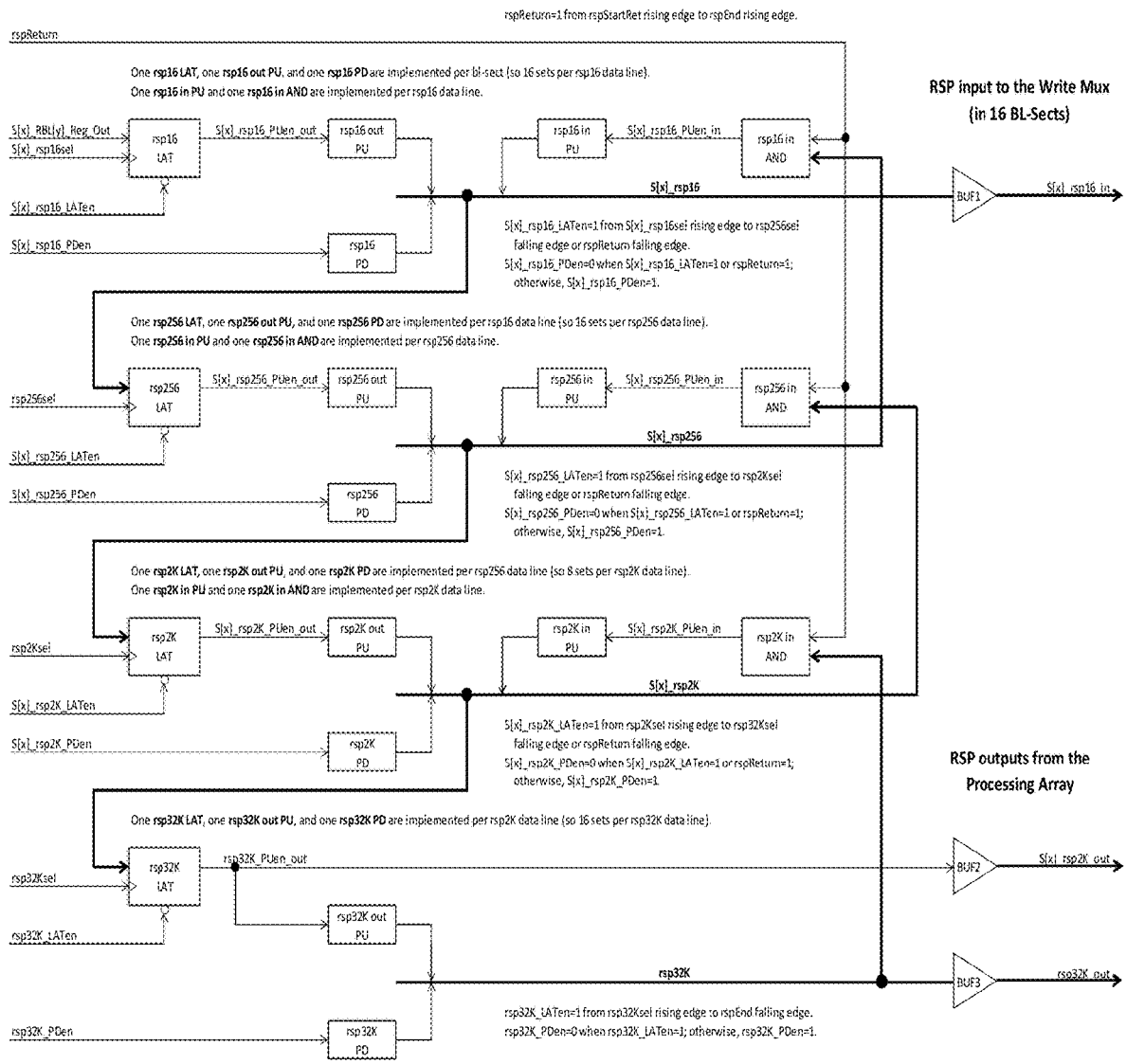
FIG. 12 illustrates the detailed RSP logic implemented in FIG. 11.

FIG. 12 illustrates the detailed RSP logic implemented in FIG. 11. The circuits include:

- The RSP control logic 1100 (shown in FIG. 11) that generates RSP control signals including:
  - An rspReturn control signal, that defaults to "0" and is only "1" from the rising edge of rspStartRet to the rising edge of rspEnd.
  - An RSP16 Latch Enable ("rsp16 LATen") control signal, that defaults to "0" and is only "1" from the rising edge of rsp16sel to the falling edge of rsp256sel or the falling edge of rspReturn.
  - An RSP16 Pull-Down Enable ("rsp16 PDen") control signal that defaults to "1", and is only "0" when rsp16_LATen=1 or rspReturn=1.

An RSP256 Latch Enable ("rsp256 LATen") control signal, that defaults to "0" and is only "1" from the rising edge of rsp256sel to the falling edge of rsp2Ksel or the falling edge of rspReturn.

An RSP256 Pull-Down Enable ("rsp256 PDen") control signal, that defaults to "1" and is only "0" when rsp256 LATen=1 or rspReturn=1.

An RSP2K Latch Enable ("rsp2K_LATen") control signal, that defaults to "0" and is only "1" from the rising edge of rsp2Ksel to the falling edge of rsp32Ksel or the falling edge of rspReturn.

An RSP2K Pull-Down Enable ("rsp2K_PDen") control signal, that defaults to "1" and is only "0" when rsp2K_LATen=1 or rspReturn=1.

An RSP32K Latch Enable ("rsp32K_LATen") control signal, that defaults to "0" and is only "1" from the rising edge of rsp32Ksel to the falling edge of rspEnd.

An RSP32K Pull-Down Enable ("rsp32K_PDen") control signal, that defaults to "1" and is only "0" when rsp32K_LATen=1.

RSP16 Out Logic (one set per bl-sect) consisting of:

An RSP16 Latch ("rsp16 LAT") whose data input is the "RBL_Reg_Out" output of the bl-sect's Read Register, whose clock input is the rsp16sel control signal, whose reset input is the rsp16 LATen control signal, and whose data output is an RSP16 Out Pull-Up Enable ("rsp16_PUen_out") control signal. The functionality of rsp16 LAT is such that when rsp16_LATen=0, then rsp16_PUen_out=0; when rsp16_LATen=1 and rsp16sel=1, then rsp16_PUen_out=RBL_Reg_Out; otherwise, rsp16_PUen_out remains unchanged.

An RSP16 Pull-Down Transistor ("rsp16 PD") implemented on the rsp16 data line, whose enable input is the rsp16 PDen control signal.

An RSP16 Out Pull-Up Transistor ("rsp16 out PU") implemented on the rsp16 data line, whose enable input is the rsp16_PUen_out control signal.

A first Buffer ("BUF1") whose input is the rsp16 data line, and whose output "rsp16 in" is driven to the bl-sect's Write Mux.

RSP16 In Logic (one set per rsp16 data line) consisting of:

An RSP16 In AND gate ("rsp16 in AND") whose output is an RSP16 In Pull-Up Enable ("rsp16_PUen_in") control signal equal to the logical AND of the rsp256 data line and rspReturn.

An RSP16 In Pull-Up Transistor ("rsp16 in PU") implemented on the rsp16 data line, whose enable input is the rsp16_PUen_in control signal.

RSP256 Out Logic (one set per rsp16 data line) consisting of:

An RSP256 Latch ("rsp256 LAT") whose data input is the rsp16 data line, whose clock input is the rsp256sel control signal, whose reset input is the rsp256 LATen control signal, and whose data output is an RSP256 Out Pull-Up Enable ("rsp256_PUen_out") control signal. The functionality of rsp256 LAT is such that when rsp256_LATen=0, then rsp256_PUen_out=0; when rsp256_LATen=1 and rsp256sel=1, then rsp256_PUen_out=RBL_Reg_Out; otherwise, rsp256_PUen_out remains unchanged.

An RSP256 Pull-Down Transistor ("rsp256 PD") implemented on the rsp256 data line, whose enable input is the rsp256 PDen control signal.

An RSP256 Out Pull-Up Transistor ("rsp256 out PU") implemented on the rsp256 data line, whose enable input is the rsp256_PUen_out control signal.

RSP256 In Logic (one set per rsp256 data line) consisting of:

An RSP256 In AND gate ("rsp256 in AND") whose output is an RSP256 In Pull-Up Enable ("rsp256_PUen_in") control signal equal to the logical AND of the rsp2K data line and rspReturn.

An RSP256 In Pull-Up Transistor ("rsp256 in PU") implemented on the rsp256 data line, whose enable input is the rsp256_PUen_in control signal.

RSP2K Out Logic (one set per rsp256 data line) consisting of:

An RSP2K Latch ("rsp2K LAT") whose data input is the rsp256 data line, whose clock input is the rsp2Ksel control signal, whose reset input is the rsp2K_LATen control signal, and whose data output is an RSP2K Out Pull-Up Enable ("rsp2K_PUen_out") control signal. The functionality of rsp2K LAT is such that when rsp2K_LATen=0, then rsp2K_PUen_out=0; when rsp2K_LATen=1 and rsp2Ksel=1, then rsp2K_PUen_out=RBL_Reg_Out; otherwise, rsp2K_PUen remains unchanged.

An RSP2K Pull-Down Transistor ("rsp2K PD") implemented on the rsp2K data line, whose enable input is the rsp2K_PDen control signal.

An RSP2K Out Pull-Up Transistor ("rsp2K out PU") implemented on the rsp2K data line, whose enable input is the rsp2K_PUen_out control signal.

RSP2K In Logic (one set per rsp2K data line) consisting of:

An RSP2K In AND gate ("rsp2K in AND") whose output is an RSP2K In Pull-Up Enable ("rsp2K_PUen_in") control signal equal to the logical AND of the rsp32K data line and rspReturn.

An RSP2K In Pull-Up Transistor ("rsp2K in PU") implemented on the rsp2K data line, whose enable input is the rsp2K_PUen_in control signal.

rsp32K Out Logic (one set per rsp2K data line) consisting of:

An RSP32K Latch ("rsp32K LAT") whose data input is the rsp2K data line, whose clock input is the rsp32Ksel control signal, whose reset input is the rsp32K_LATen control signal, and whose data output is an RSP32K Pull-Up Enable ("rsp32K_PUen_out") control signal. The functionality of rsp32K LAT is such that when rsp32K_LATen=0, then rsp32K_PUen_out=0; when rsp32K_LATen=1 and rsp32Ksel=1, then rsp32K_PUen_out=RBL_Reg_Out; otherwise, rsp32K_PUen remains unchanged.

An RSP32K Pull-Down Transistor ("rsp32K PD") implemented on the rsp32K data line, whose enable input is the rsp32K_PDen control signal.

An RSP32K Out Pull-Up Transistor ("rsp32K out PU") implemented on the rsp32K data line, whose enable input is the rsp32K_PUen control signal.

A second Buffer ("BUF2") whose input is the rsp32K_PUen_out control signal, and whose output "rsp2K_out" is driven out of the processing array. In the depicted implementation, there is one BUF2 per section.

A third Buffer ("BUF3") whose input is the rsp32K data line, and whose output "rsp32K_out" is driven out of the processing array. In the depicted implementation, there is one BUF3 per 16 sections.

FIGS. 13-17 illustrate the RSP signal timing associated with the circuit in FIG. 12. In all five figures:

The timing diagrams illustrates the minimum delays required between the assertion of rsp16sel and the assertion of each successive RSP control signal (i.e. rsp256sel, rsp2Ksel, rsp32Ksel, rspStartRet, rspEnd), and the assertion of GWE, required for the depicted flow. If needed, these delays can be increased without affecting the depicted RSP functionality.

The RSP implementation in FIG. 12 allows for a non-RSP read operation to be initiated in any cycle(s) after an RSP read operation is initiated, without affecting the RSP result associated with that RSP read operation.

Figure 13:
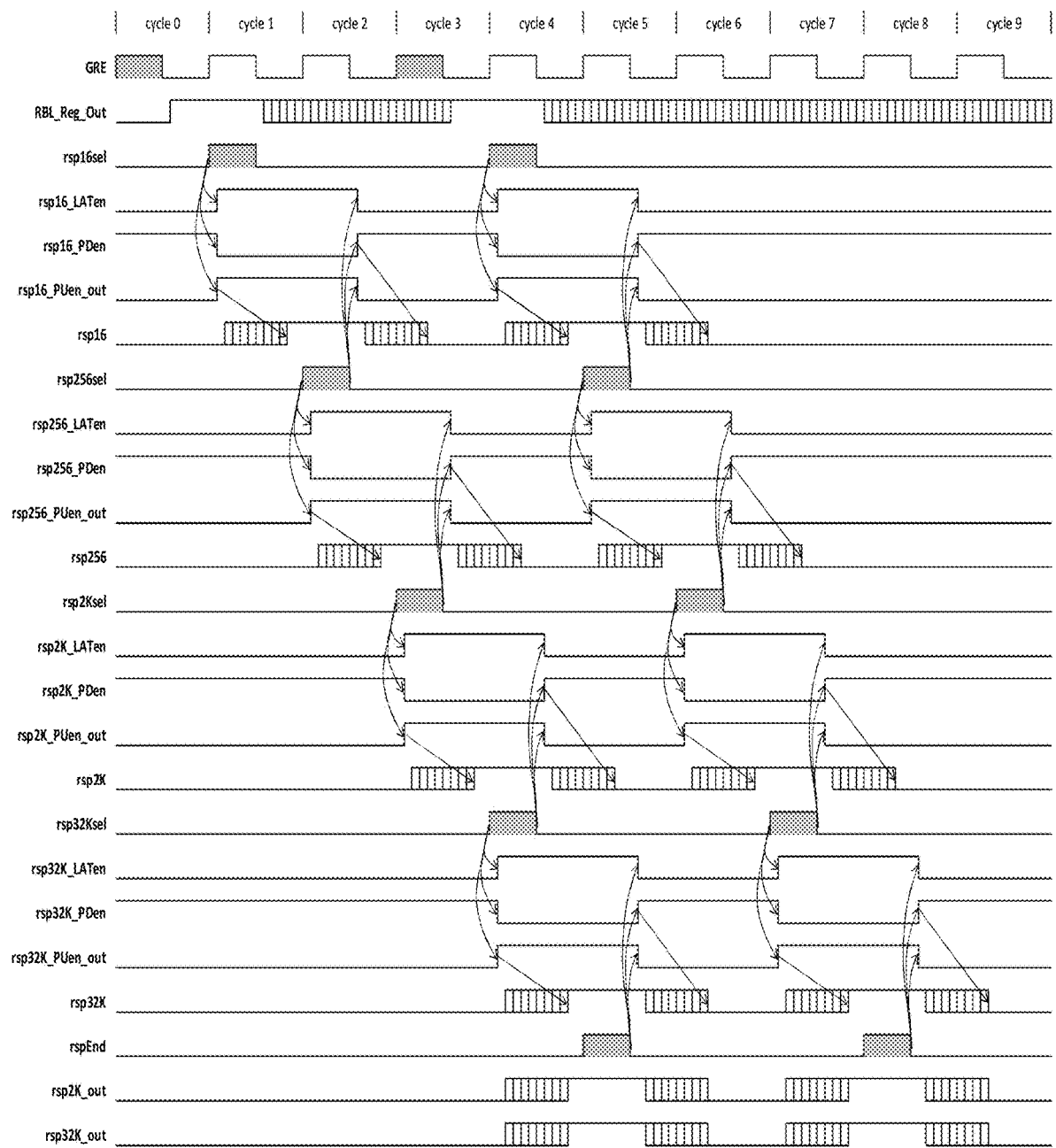
FIG. 13 illustrates an example of the signal timing for generating an rsp2K result and an resp32K result and transmitting those results out of the processing array.

FIG. 13 illustrates an example of the signal timing for generating an rsp2K result and an resp32K result and transmitting those results out of the processing array.

1. In cycle 0, GRE is asserted to "1" for a half-cycle to initiate a read operation that causes a computation result="1" to be captured in the bl-sect Read Register. In this cycle, rsp16_LATen="0" (its default state) and rsp16_PDen="1" (its default state), thereby causing rsp16_PUen_out="0" (its default state), thereby causing the rsp16 data line="0" (its default state).
2. In cycle 1, rsp16sel is asserted to "1" for a half-cycle to engage stage 1 outbound RSP functionality. The rising edge of rsp16sel causes rsp16_LATen="1" and rsp16_PDen="0", and rsp16sel=1 causes rsp16 LAT to capture the RBL_Reg_Out output of the Read Register (i.e. the logic "1" from cycle 0), thereby causing rsp16_PUen_out="1", thereby causing the rsp16 data line="1".
3. In cycle 2, rsp256sel is asserted to "1" for a half-cycle to engage stage 2 outbound RSP functionality. The rising edge of rsp256sel causes rsp256_LATen="1" and rsp256_PDen="0", and rsp256sel=1 causes rsp256 LAT to capture the state of the rsp16 data line (i.e. the logic "1" from cycle 1), thereby causing rsp256 PUen_out="1", thereby causing the rsp256 data line="1". The falling edge of rsp256sel causes rsp16 LATen="0" and rsp16_PDen="1", thereby causing rsp16_PUen_out="0", thereby causing the rsp16 data line="0" (back to its default state).
4. In cycle 3, rsp2Ksel is asserted to "1" for a half-cycle to engage stage 3 outbound RSP functionality. The rising edge of rsp2Ksel causes rsp2K_LATen="1" and rsp2K_PDen="0", and rsp2Ksel=1 causes rsp2K LAT to capture the state of the rsp256 data line (i.e. the logic "1" from cycle 2), thereby causing rsp2K_PUen_out="1", thereby causing the rsp2K data line="1". The falling edge of rsp2Ksel causes rsp256_LATen="0" and rsp256_PDen="1", thereby causing rsp256_PUen_out="0", thereby causing the rsp256 data line="0" (back to its default state).
5. In cycle 4, rsp32Ksel is asserted to "1" for a half-cycle to engage stage 4 outbound RSP functionality. The rising edge of rsp32Ksel causes rsp32K_LATen="1" and rsp32K_PDen="0", and rsp32Ksel=1 causes rsp32K LAT to capture the state of the rsp2K data line (i.e. the logic "1" from cycle 3), thereby causing rsp32K_PUen_out="1", thereby causing the rsp32K data line="1". The falling edge of rsp32Ksel causes rsp2K_LATen="0" and rsp2K_PDen="1", thereby causing rsp2K_PUen_out="0", thereby causing the rsp2K data line="0" (back to its default state).
6. In cycle 5, rspEnd is asserted to "1" for a half-cycle to disengage outbound RSP functionality. The falling edge of rspEnd causes rsp32K_LATen="0" and rsp32K_PDen="1", thereby causing rsp32K_PUen_out="0", thereby causing the rsp32K data line="0" (back to its default state).

The RSP implementation in FIG. 9 allows for "RSP" read operations to be initiated every 3 cycles, when RSP is engaged to drive RSP results out of the processing array.

Figure 14:
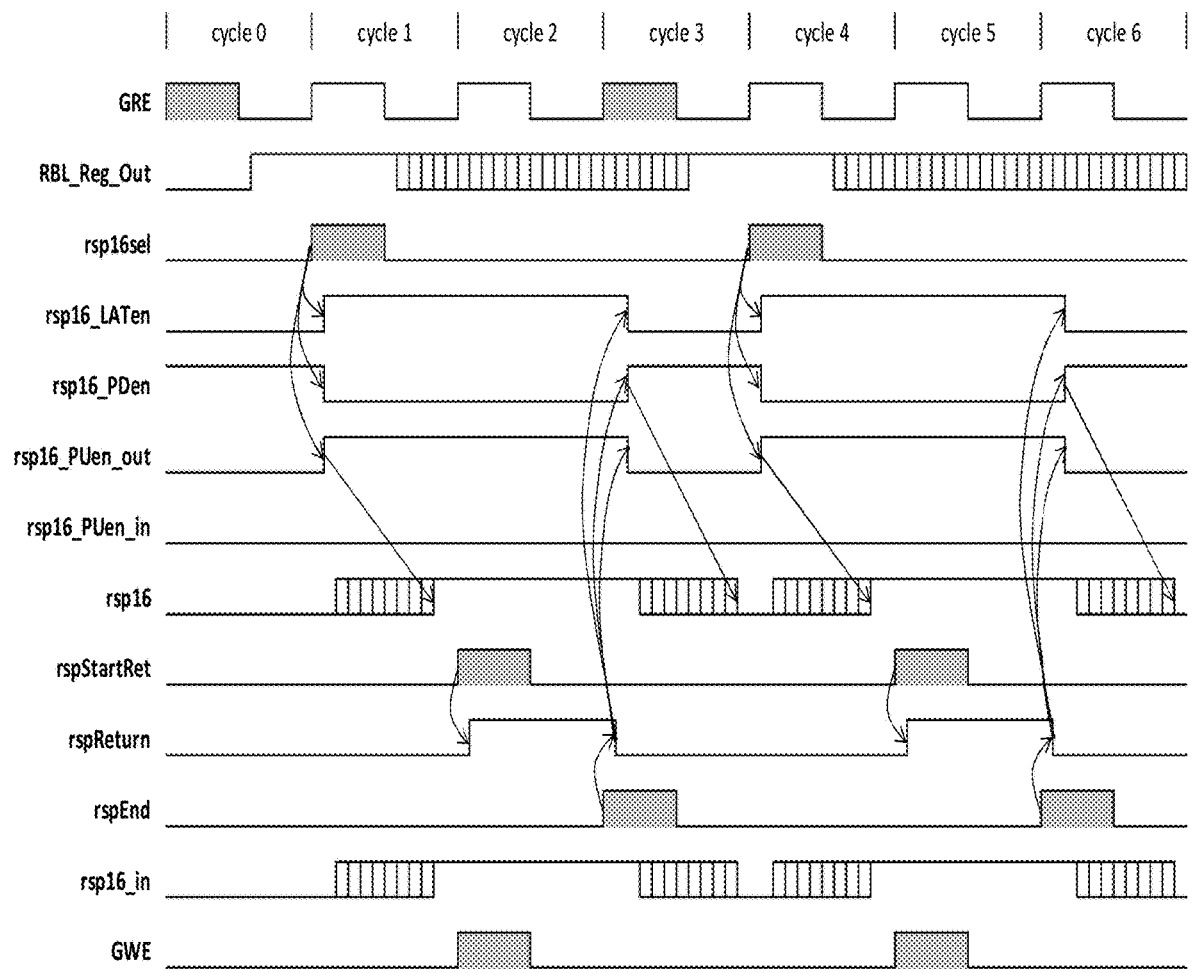
FIG. 14 illustrates an example of the signal timing for generating an rsp16 result and transmitting that result to the write multiplexer in each bit line section.

FIG. 14 illustrates an example of the signal timing for generating an rsp16 result and transmitting that result to the write multiplexer in each bit line section when RSP is engaged to produce and store rsp16 results in the bl_sects.

1. In cycle 0, GRE is asserted to "1" for a half-cycle to initiate a read operation that causes a computation result="1" to be captured in the bl-sect Read Register. In this cycle, rsp16_LATen="0" (its default state) and rsp16_PDen="1" (its default state), thereby causing rsp16_PUen_out="0" (its default state), thereby causing the rsp16 data line="0" (its default state).
2. In cycle 1, rsp16sel is asserted to "1" for a half-cycle to engage stage 1 outbound RSP functionality. The rising edge of rsp16sel causes rsp16_LATen="1" and rsp16 PDen="0", and rsp16sel=1 causes rsp16 LAT to capture the RBL_Reg_Out output of the Read Register (i.e. the logic "1" from cycle 0), thereby causing rsp16_PUen_out="1", thereby causing the rsp16 data line="1".
3. In cycle 2, rspStartRet is asserted to "1" for a half-cycle to disengage outbound RSP functionality and engage inbound RSP functionality. The rising edge of rspStartRet causes rspReturn="1".
4. In cycle 2 (and one cycle before rspEnd is asserted), GWE is asserted to "1" for a half-cycle to initiate a write operation that stores the state of the rsp16 data line in a computational memory cell in the bl-sect.
5. In cycle 3, rspEnd is asserted to "1" for a half-cycle to disengage inbound RSP functionality. The rising edge of rspEnd causes rspReturn="0", thereby causing rsp16_LATen="0" and rsp16_PDen="1", thereby causing rsp16_PUen_out="0", thereby causing the rsp16 data line="0" (back to its default state).

The RSP implementation in FIG. 11 allows for "RSP" read operations to be initiated every 3 cycles, when RSP is engaged to produce and store rsp16 results in the bl-sects.

Figure 15:
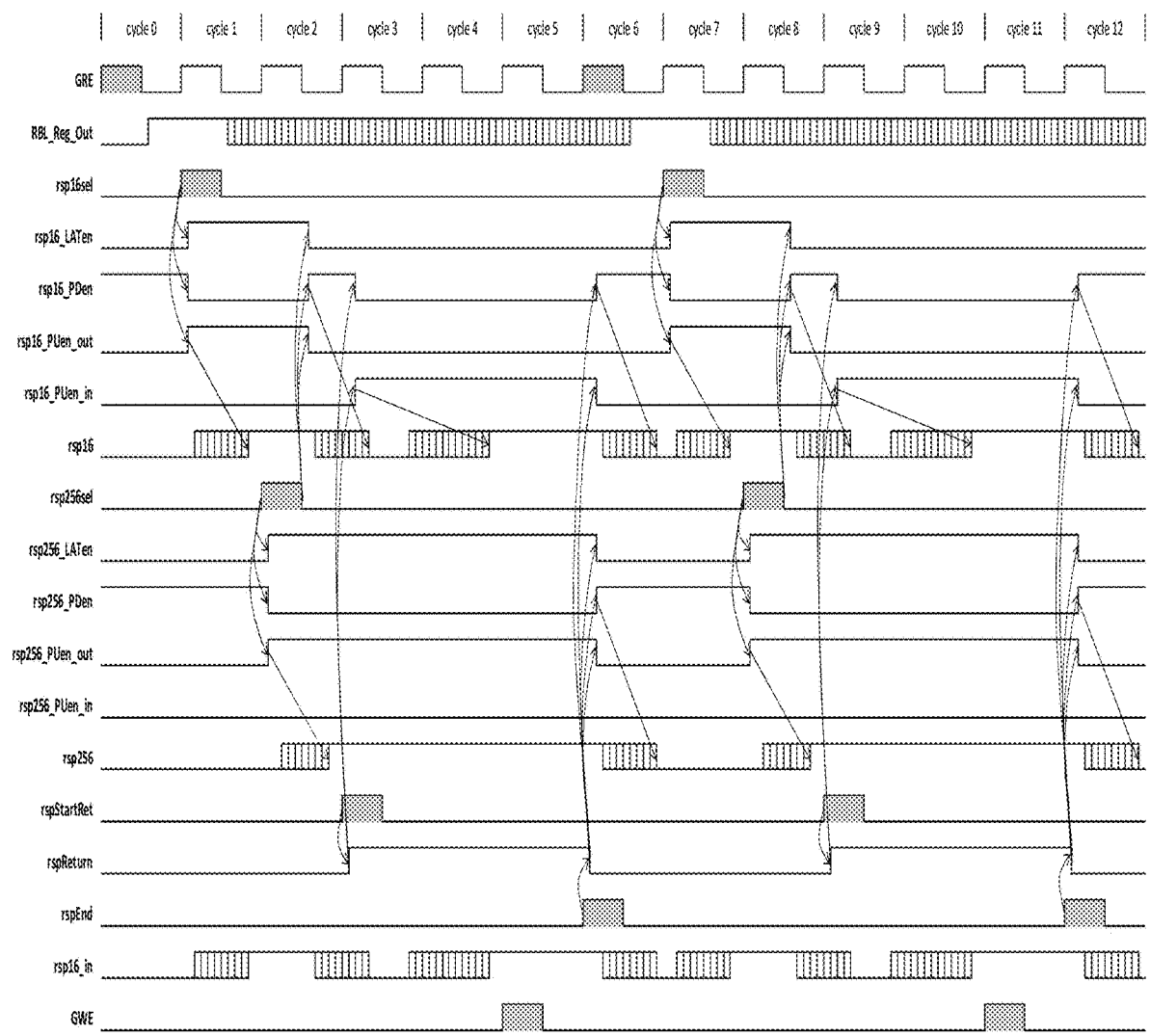
FIG. 15 illustrates an example of the signal timing for generating an rsp256 result, transmitting the result back to rsp16 and transmitting that result to the write multiplexer in each bit line section.

FIG. 15 illustrates an example of the signal timing for generating an rsp256 result, transmitting the result back to rsp16 and transmitting that result to the write multiplexer in each bit line section when RSP is engaged to produce and store rsp256 results in the bl_sects.

1. In cycle 0, GRE is asserted to "1" for a half-cycle to initiate a read operation that causes a computation result="1" to be captured in the bl-sect Read Register. In this cycle, rsp16_LATen="0" (its default state) and rsp16_PDen="1" (its default state), thereby causing rsp16_PUen_out="0" (its default state), thereby causing the rsp16 data line="0" (its default state).
2. In cycle 1, rsp16sel is asserted to "1" for a half-cycle to engage stage 1 outbound RSP functionality. The rising edge of rsp16sel causes rsp16_LATen="1" and rsp16_PDen="0", and rsp16sel=1 causes rsp16 LAT to capture the RBL_Reg_Out output of the Read Register (i.e. the logic "1" from cycle 0), thereby causing rsp16_PUen_out="1", thereby causing the rsp16 data line="1".
3. In cycle 2, rsp256sel is asserted to "1" for a half-cycle to engage stage 2 outbound RSP functionality. The rising edge of rsp256sel causes rsp256_LATen="1" and rsp256_PDen="0", and rsp256sel=1 causes rsp256 LAT to capture the state of the rsp16 data line (i.e. the logic "1" from cycle 1), thereby causing rsp256_PUen_out="1", thereby causing the rsp256 data line="1". The falling edge of rsp256sel causes rsp16_LATen="0" and rsp16_PDen="1", thereby causing rsp16_PUen_out="0", thereby causing the rsp16 data line="0" (back to its default state).

4. In cycle 3, rspStartRet is asserted to "1" for a half-cycle to disengage outbound RSP functionality and engage inbound RSP functionality. The rising edge of rspStartRet causes rspReturn="1", thereby causing rsp16_PDen="0" and (because the rsp256 data line="1") rsp16_PUen_in ="1", thereby causing the rsp16 data line="1".

5. In cycle 5 (and one cycle before rspEnd is asserted), GWE is asserted to "1" for a half-cycle to initiate a write operation that stores the state of the rsp16 data line in a computational memory cell in the bl-sect.

6. In cycle 6, rspEnd is asserted to "1" for a half-cycle to disengage inbound RSP functionality. The rising edge of rspEnd causes rspReturn="0", thereby causing rsp256_LATen="0" and rsp256_PDen="1", thereby causing rsp256 PUen_out="0", thereby causing the rsp256 data line="0" (back to its default state). The falling edge of rspReturn also causes rsp16_PDen="1" and rsp16_PUen_in ="0", thereby causing the rsp16 data line="0" (back to its default state).

The RSP implementation in FIG. 9 allows for "RSP" read operations to be initiated every 6 cycles, when RSP is engaged to produce and store rsp256 results in the bl-sects.

Figure 16:
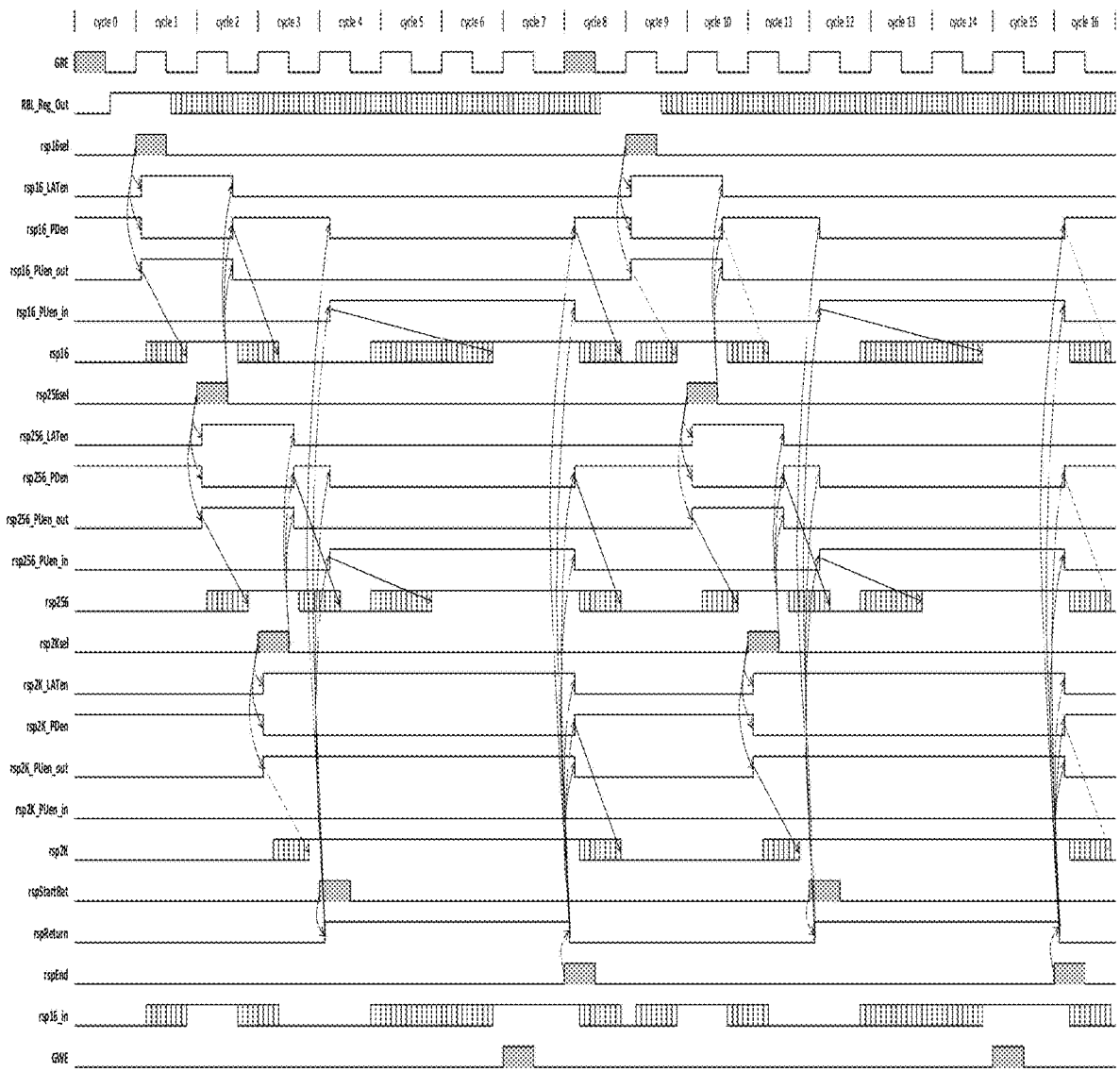
FIG. 16 illustrates an example of the signal timing for generating an rsp2K result, transmitting the result back to rsp256 and then to rsp16 and transmitting that result to the write multiplexer in each bit line section.

FIG. 16 illustrates an example of the signal timing for generating an rsp2K result, transmitting the result back to rsp256 and then to rsp16 and transmitting that result to the write multiplexer in each bit line section when RSP is engaged to produce and store rsp2K results in the bl_sects.

1. In cycle 0, GRE is asserted to "1" for a half-cycle to initiate a read operation that causes a computation result="1" to be captured in the bl-sect Read Register. In this cycle, rsp16_LATen="0" (its default state) and rsp16 PDen="1" (its default state), thereby causing rsp16_PUen_out="0" (its default state), thereby causing the rsp16 data line="0" (its default state).

2. In cycle 1, rsp16sel is asserted to "1" for a half-cycle to engage stage 1 outbound RSP functionality. The rising edge of rsp16sel causes rsp16_LATen="1" and rsp16_PDen="0", and rsp16sel=1 causes rsp16 LAT to capture the RBL_Reg_Out output of the Read Register (i.e. the logic "1" from cycle 0), thereby causing rsp16_PUen_out="1", thereby causing the rsp16 data line="1".

3. In cycle 2, rsp256sel is asserted to "1" for a half-cycle to engage stage 2 outbound RSP functionality. The rising edge of rsp256sel causes rsp256_LATen="1" and rsp256_PDen="0", and rsp256sel=1 causes rsp256 LAT to capture the state of the rsp16 data line (i.e. the logic "1" from cycle 1), thereby causing rsp256_PUen_out="1", thereby causing the rsp256 data line="1". The falling edge of rsp256sel causes rsp16_LATen="0" and rsp16_PDen="1", thereby causing rsp16_PUen_out="0", thereby causing the rsp16 data line="0" (back to its default state).

4. In cycle 3, rsp2Ksel is asserted to "1" for a half-cycle to engage stage 3 outbound RSP functionality. The rising edge of rsp2Ksel causes rsp2K_LATen="1" and rsp2K_PDen="0", and rsp2Ksel=1 causes rsp2K LAT to capture the state of the rsp256 data line (i.e. the logic "1" from cycle 2), thereby causing rsp2K_PUen_out="1", thereby causing the rsp2K data line="1". The falling edge of rsp2Ksel causes rsp256_LATen="0" and rsp256_PDen="1", thereby causing rsp256_PUen_out="0", thereby causing the rsp256 data line="0" (back to its default state).

5. In cycle 4, rspStartRet is asserted to "1" for a half-cycle to disengage outbound RSP functionality and engage inbound RSP functionality. The rising edge of rspStartRet causes rspReturn="1", thereby causing rsp256_PDen="0" and (because the rsp2K data line="1") rsp256_PUen_in ="1", thereby causing the rsp256 data line="1". The rising edge of rspReturn also causes rsp16_PDen="0" and (because the rsp256 data line="1") rsp16_PUen_in ="1", thereby causing the rsp16 data line="1".

6. In cycle 7 (and one cycle before rspEnd is asserted), GWE is asserted to "1" for a half-cycle to initiate a write operation that stores the state of the rsp16 data line in a computational memory cell in the bl-sect.

7. In cycle 8, rspEnd is asserted to "1" for a half-cycle to disengage inbound RSP functionality. The rising edge of rspEnd causes rspReturn="0", thereby causing rsp2K_LATen="0" and rsp2K_PDen="1", thereby causing rsp2K_PUen_out="0", thereby causing the rsp2K data line="0" (back to its default state). The falling edge of rspReturn also causes rsp256_PDen="1" and rsp256_PUen_in ="0", thereby causing the rsp256 data line="0" (back to its default state). The falling edge of rspReturn also causes rsp16_PDen="1" and rsp16_PUen_in ="0", thereby causing the rsp16 data line="0" (back to its default state).

The RSP implementation in FIG. 11 allows for "RSP" read operations to be initiated every 8 cycles, when RSP is engaged to produce and store rsp2K results in the bl-sects.

Figure 17:
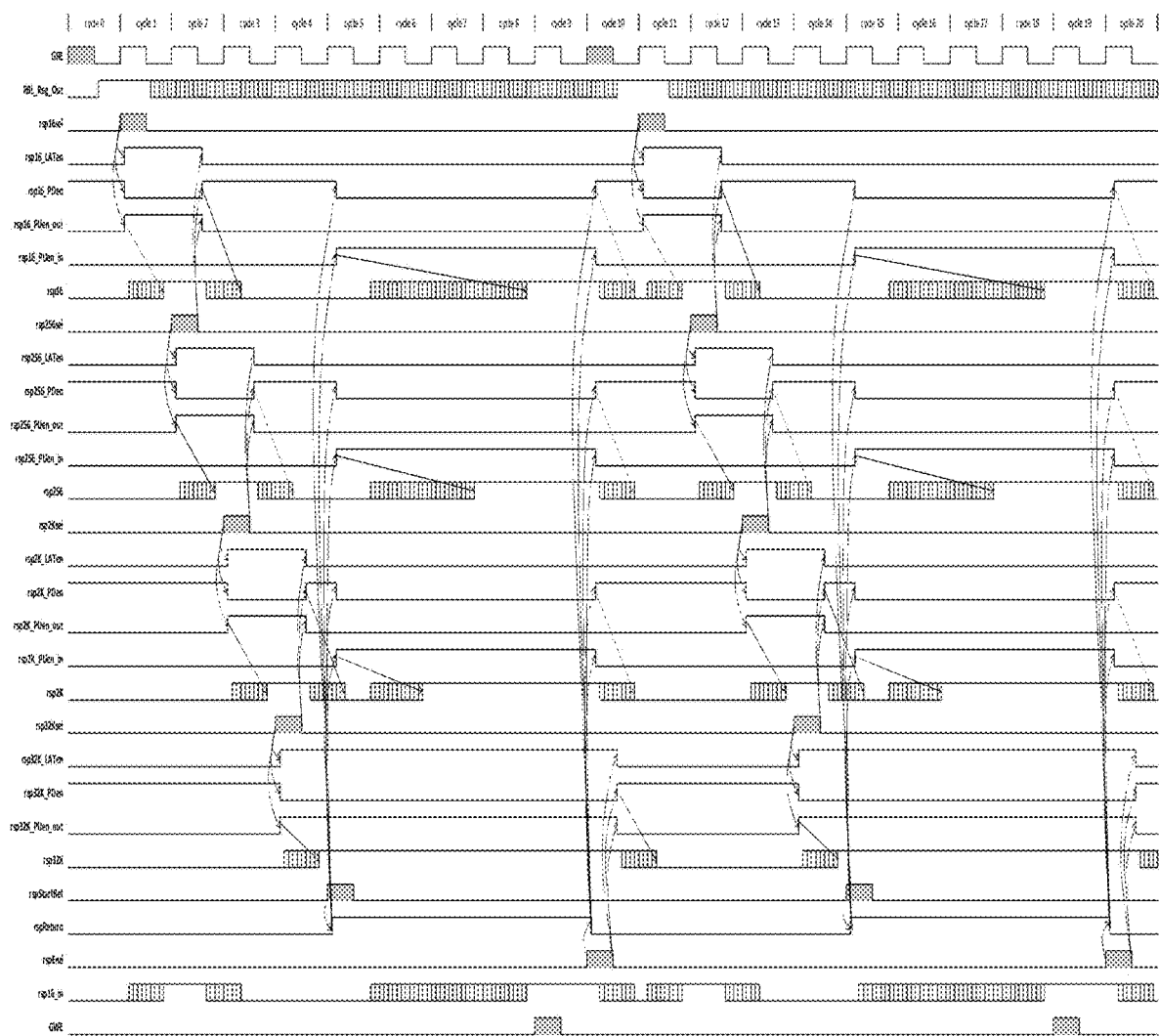
FIG. 17 illustrates an example of the signal timing for generating an rsp32K result, transmitting the result back to rsp2K, to rsp256 and then to rsp16 and transmitting that result to the write multiplexer in each bit line section.

FIG. 17 illustrates an example of the signal timing for generating an rsp32K result, transmitting the result back to rsp2K, to rsp256 and then to rsp16 and transmitting that result to the write multiplexer in each bit line section.

1. In cycle 0, GRE is asserted to "1" for a half-cycle to initiate a read operation that causes a computation result="1" to be captured in the bl-sect Read Register. In this cycle, rsp16_LATen="0" (its default state) and rsp16 PDen="1" (its default state), thereby causing rsp16_PUen_out="0" (its default state), thereby causing the rsp16 data line="0" (its default state).

2. In cycle 1, rsp16sel is asserted to "1" for a half-cycle to engage stage 1 outbound RSP functionality. The rising edge of rsp16sel causes rsp16 LATen="1" and rsp16 PDen="0", and rsp16sel=1 causes rsp16 LAT to capture the RBL_Reg_Out output of the Read Register (i.e. the logic "1" from cycle 0), thereby causing rsp16_PUen_out="1", thereby causing the rsp16 data line="1".

3. In cycle 2, rsp256sel is asserted to "1" for a half-cycle to engage stage 2 outbound RSP functionality. The rising edge of rsp256sel causes rsp256_LATen="1" and rsp256_PDen="0", and rsp256sel=1 causes rsp256 LAT to capture the state of the rsp16 data line (i.e. the logic "1" from cycle 1), thereby causing rsp256_PUen_out="1", thereby causing the rsp256 data line="1". The falling edge of rsp256sel causes rsp16 LATen="0" and rsp16_PDen="1", thereby causing rsp16_PUen_out="0", thereby causing the rsp16 data line="0" (back to its default state).

4. In cycle 3, rsp2Ksel is asserted to "1" for a half-cycle to engage stage 3 outbound RSP functionality. The rising edge of rsp2Ksel causes rsp2K_LATen="1" and rsp2K_PDen="0", and rsp2Ksel=1 causes rsp2K LAT to capture the state of the rsp256 data line (i.e. the logic "1" from cycle 2), thereby causing rsp2K_PUen_out="1", thereby causing the rsp2K data line="1". The falling edge of rsp2Ksel causes rsp256_LATen="0" and rsp256_PDen="1", thereby causing rsp256 PUen_out="0", thereby causing the rsp256 data line="0" (back to its default state).
5. In cycle 4, rsp32Ksel is asserted to "1" for a half-cycle to engage stage 4 outbound RSP functionality. The rising edge of rsp32Ksel causes rsp32K_LATen="1" and rsp32K_PDen="0", and rsp32Ksel=1 causes rsp32K LAT to capture the state of the rsp2K data line (i.e. the logic "1" from cycle 3), thereby causing rsp32K_PUen_out="1", thereby causing the rsp32K data line="1". The falling edge of rsp32Ksel causes rsp2K_LATen="0" and rsp2K_PDen="1", thereby causing rsp2K_PUen_out="0", thereby causing the rsp2K data line="0" (back to its default state).
6. In cycle 5, rspStartRet is asserted to "1" for a half-cycle to disengage outbound RSP functionality and engage inbound RSP functionality. The rising edge of rspStartRet causes rspReturn="1", thereby causing rsp2K_PDen="0" and (because the rsp32K data line="1") rsp2K_PUen_in ="1", thereby causing the rsp2K data line="1". The rising edge of rspReturn also causes rsp256_PDen="0" and (because the rsp2K data line="1") rsp256_PUen_in ="1", thereby causing the rsp256 data line="1". The rising edge of rspReturn also causes rsp16_PDen="0" and (because the rsp256 data line="1") rsp16_PUen_in ="1", thereby causing the rsp16 data line="1".
7. In cycle 9 (and one cycle before rspEnd is asserted), GWE is asserted to "1" for a half-cycle to initiate a write operation that stores the state of the rsp16 data line in a computational memory cell in the bl-sect.
8. In cycle 10, rspEnd is asserted to "1" for a half-cycle to disengage inbound RSP functionality. The rising edge of rspEnd causes rspReturn="0", thereby causing rsp2K_PDen="1" and rsp2K_PUen_in ="0", thereby causing the rsp2K data line="0" (back to its default state). The falling edge of rspReturn also causes rsp256_PDen="1" and rsp256_PUen_in ="0", thereby causing the rsp256 data line="0" (back to its default state). The falling edge of rspReturn also causes rsp16_PDen="1" and rsp16_PUen_in ="0", thereby causing the rsp16 data line="0" (back to its default state). The falling edge of rspEnd causes rsp32K_LATen="0" and rsp32K_PDen="1", thereby causing rsp32K_PUen_out="0", thereby causing the rsp32K data line="0" (back to its default state).

The RSP implementation in FIG. 11 allows for "RSP" read operations to be initiated every 10 cycles, when RSP is engaged to produce and store rsp32K results in the bl-sects.

Figure 18:
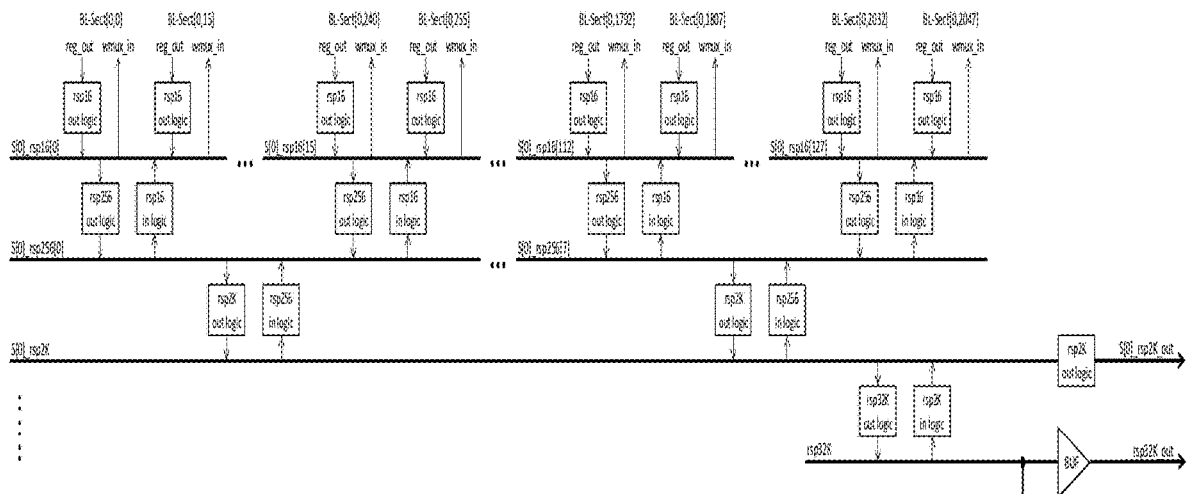
FIG. 18 illustrates the high level RSP functionality for sixteen sections with 2K bit lines.
Figure 18:
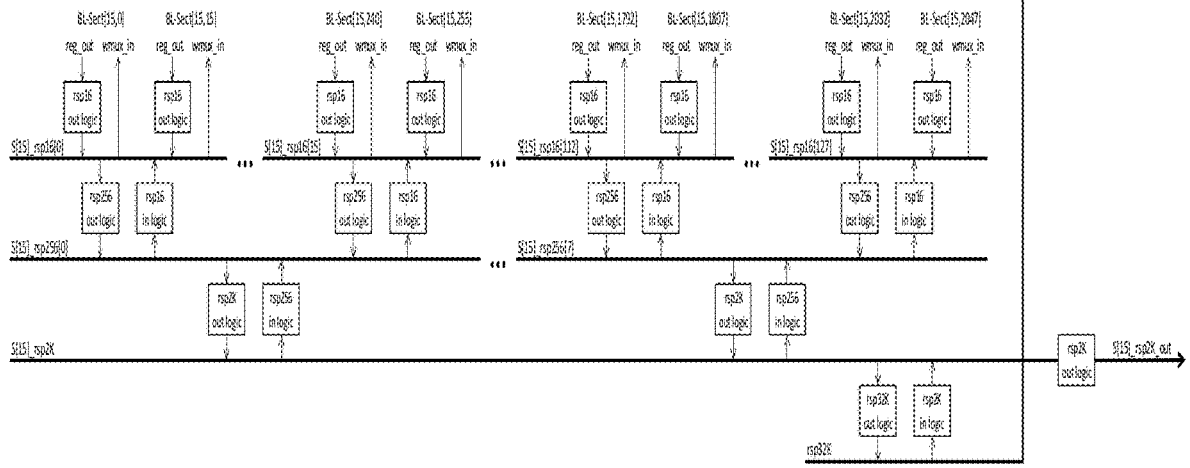

FIG. 18 illustrates the high level RSP functionality for sixteen sections with 2K bit lines when 16 sections with 2K bit lines each are implemented in the processing array device according to FIGS. 10-12. As shown, within a section there are:

128 rsp16 data lines—one per each group of 16 bls of 2K.
8 rsp256 data lines—one per each group of 16 rsp16 data lines, i.e. one per each group of 256 bls of 2K.
1 rsp2K data line—one per a single group of 8 rsp256 data lines, i.e. one per all 2K bls.

And across all 16 sections there is:
1 rsp32K data line—one per a single group of 16 rsp2K data lines, i.e. one per 32K bls.

The foregoing description, for purpose of explanation, has been described with reference to specific embodiments. However, the illustrative discussions above are not intended to be exhaustive or to limit the disclosure to the precise forms disclosed. Many modifications and variations are possible in view of the above teachings. The embodiments were chosen and described in order to best explain the principles of the disclosure and its practical applications, to thereby enable others skilled in the art to best utilize the disclosure and various embodiments with various modifications as are suited to the particular use contemplated.

The system and method disclosed herein may be implemented via one or more components, systems, servers, appliances, other subcomponents, or distributed between such elements. When implemented as a system, such systems may include an/or involve, inter alia, components such as software modules, general-purpose CPU, RAM, etc. found in general-purpose computers. In implementations where the innovations reside on a server, such a server may include or involve components such as CPU, RAM, etc., such as those found in general-purpose computers.

Additionally, the system and method herein may be achieved via implementations with disparate or entirely different software, hardware and/or firmware components, beyond that set forth above. With regard to such other components (e.g., software, processing components, etc.) and/or computer-readable media associated with or embodying the present inventions, for example, aspects of the innovations herein may be implemented consistent with numerous general purpose or special purpose computing systems or configurations. Various exemplary computing systems, environments, and/or configurations that may be suitable for use with the innovations herein may include, but are not limited to: software or other components within or embodied on personal computers, servers or server computing devices such as routing/connectivity components, handheld or laptop devices, multiprocessor systems, microprocessor-based systems, set top boxes, consumer electronic devices, network PCs, other existing computer platforms, distributed computing environments that include one or more of the above systems or devices, etc.

In some instances, aspects of the system and method may be achieved via or performed by logic and/or logic instructions including program modules, executed in association with such components or circuitry, for example. In general, program modules may include routines, programs, objects, components, data structures, etc. that performs particular tasks or implement particular instructions herein. The inventions may also be practiced in the context of distributed software, computer, or circuit settings where circuitry is connected via communication buses, circuitry or links. In distributed settings, control/instructions may occur from both local and remote computer storage media including memory storage devices.

The software, circuitry and components herein may also include and/or utilize one or more type of computer readable media. Computer readable media can be any available media that is resident on, associable with, or can be accessed by such circuits and/or computing components. By way of example, and not limitation, computer readable media may comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules and/or other components. Further, communication media may include wired media such as a wired network or direct-wired connection, however no media of any such type herein includes transitory media. Combinations of the any of the above are also included within the scope of computer readable media.

In the present description, the terms component, module, device, etc. may refer to any type of logical or functional software elements, circuits, blocks and/or processes that may be implemented in a variety of ways. For example, the functions of various circuits and/or blocks can be combined with one another into any other number of modules. Each module may even be implemented as a software program stored on a tangible memory (e.g., random access memory, read only memory, CD-ROM memory, hard disk drive, etc.) to be read by a central processing unit to implement the functions of the innovations herein. Or, the modules can comprise programming instructions transmitted to a general purpose computer or to processing/graphics hardware via a transmission carrier wave. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, features consistent with the disclosure may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may also be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) though again does not include transitory media. Unless the context clearly requires otherwise, throughout the description, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

While the foregoing has been with reference to a particular embodiment of the disclosure, it will be appreciated by those skilled in the art that changes in this embodiment may be made without departing from the principles and spirit of the disclosure, the scope of which is defined by the appended claims.

The invention claimed is:

1. A processing array device, comprising:
a plurality of memory cells arranged in an array having a plurality of columns and a plurality of rows, each memory cell having a storage element wherein the array has a plurality of sections and each section has a plurality of bit line sections and a plurality of bit lines with one bit line per bit line section, wherein the memory cells in each bit line section are all connected to a single read bit line that generates a computation result and the plurality of bit lines in each section are distinct from the plurality of bit lines included in the other sections of the array;

each bit line section having a read storage device that captures the computation result;

each section having circuitry to logically combine the computation results captured by the bit line sections in the section;

each bit line section having circuitry that stores the combined computation results in one or more memory cells in the bit line section;

an RSP data line, connected to each bit line section, that communicates the combined computation result outside of the processing array device; and wherein each section has an RSP data line that communicates the computation results for the plurality of bit line sections in the section, and wherein each bit line section has circuitry that generates a logical OR on the RSP data line of the computation results captured in all of the read storage devices in each of the bit line sections in the section and each bit line section stores the combined computation result.

2. The processing array device of claim 1 further comprising one or more pull-down transistors are connected to the RSP data line that are enabled during a default state of the RSP data line, wherein each bit line section has a pull-up transistor connected to the RSP data line that is disabled during the default state of the RSP line and wherein, when the RSP function is enabled, each pull-down transistor is disabled, the pull-up transistor associated with each bit line section is enabled if the computational result captured in the read storage device is a logical one so that the bit line section circuitry generates the logical OR.

3. The processing array device of claim 2, wherein each bit line section further comprises RSP logic having inputs from the read storage device of the bit line section, an RSP select control signal and an RSP end control signal and an ouput that drives the RSP data line and wherein each bit line section has a write data selection circuit that selects the data being written into the one or more memory cells of the bit line section wherein an input of the write data selection circuit is the RSP data line.

4. The processing array device of claim 3, wherein the write data selection circuit further comprises a multiplexer.

5. The processing array device of claim 3, wherein the RSP logic in each bit line section generates a RSP pull down enable control signal that is a logic zero from a rising edge of a RSP select control signal to a falling edge of the RSP end control signal, the RSP logic in each bit line section further comprises a latch having a data input that is the output of the read storage device, a clock input connected to the RSP select control signal, a reset input connected to a RSP pull down enable (RSP_PDen) control signal and a data output that is a RSP pull up enable (RSP_PUen) control signal.

6. The processing array device of claim 5, wherein the RSP logic in each bit line section further comprises a pull down transistor whose enable input is the RSP_PDen control signal and whose output is connected to RSP data line and a pull up transistor whose enable input is the RSP_PUen control signal and whose output is connected to the RSP data line.

7. The processing array device of claim 6, wherein the RSP logic in each bit line section further comprises a first buffer whose input is the RSP data line and whose output is an input to a write multiplexer in each bit line section and a second buffer whose input is the RSP data line and whose output is an output signal off of the processing array device.

8. The processing array device of claim 1 further comprising a plurality of RSP data lines wherein each RSP data line is connected to a larger number of bit line sections in the processing array device.

9. The processing array device of claim 8, wherein the plurality of RSP data lines further comprises a plurality of RSP data line stages wherein each RSP data line stage is connected to a subset of the bit line sections in each section, a first particular RSP data line stage that is connected to all of the bit line sections in a section and a second particular RSP data line that is connected to each of the bit lines sections across a plurality of sections.

10. The processing array device of claim 9 further comprising RSP outbound circuitry, connected to each of the plurality of RSP data line stages, that produces a logical OR, on each of the plurality of RSP data line stages, of the computation results captured in the read storage of the bit line sections.

11. The processing array device of claim 10 further comprising RSP outbound circuitry in each section that produces a logical OR on each successive outbound stage RSP data line.

12. The processing array device of claim 11 further comprises RSP inbound circuitry, connected to each of the plurality of RSP data line stages, that propagates the logical OR result, when the RSP outbound flow is halted, from a particular RSP data line stage to each pervious RSP data line stage including the first RSP data line stage and stores the result in the bit line sections.

13. The processing array device of claim 12 further comprising RSP inbound circuitry in each section that enables a state of the second particular RSP data line to all first RSP data lines spanned by the second particular RSP data line.

14. The processing array device of claim 11, wherein the plurality of RSP data line stages further comprises a first RSP data line stage and a plurality of subsequent RSP data line stages.

15. The processing array device of claim 11, wherein the plurality of section further comprises sixteen section wherein each section further comprises 2048 bit lines and wherein the plurality of RSP data lines further comprises a plurality of first stage RSP data lines with each first stage RSP data line spanning a unique group of sixteen bit line sections in the section, a plurality of second stage RSP data lines with each second stage RSP data line spanning a unique group of sixteen first stage RSP data lines in the section, a third stage RSP data line that spans the plurality of second stage RSP data lines in the section and a fourth stage RSP data line for all sixteen sections that spans the third stage data lines for all sections in the processing array device.

16. The processing array device of claim 15, wherein each section has RSP control logic that generates control signals for the plurality of first stage RSP data lines, the plurality of second stage RSP data lines, a third stage RSP data line and a fourth stage RSP data line.

17. The processing array device of claim 16 further comprising a first stage RSP data line out logic whose input is the output of the bit line section read storage device and that is controlled by the RSP control logic control signals and whose output drives the first stage RSP data line, a second stage RSP data line out logic whose input is the first stage RSP data line and that is controlled by the RSP control logic control signals and whose output drives the second stage RSP data line, a third stage RSP data line out logic whose input is the second stage RSP data line and that is controlled by the RSP control logic control signals and whose output drives the third stage RSP data line, and a fourth stage RSP data line out logic whose input is the third stage RSP data line and that is controlled by the RSP control logic control signals and whose output drives the fourth stage RSP data line.

18. The processing array device of claim 17 further comprising a third stage RSP data line in logic whose input is the fourth stage RSP data line and that is controlled by the RSP control logic control signals and whose output drives the third stage RSP data line, a second stage RSP data line in logic whose input is the third stage RSP data line and that is controlled by the RSP control logic control signals and whose output drives the second stage RSP data line, and a first stage RSP data line in logic whose input is the second stage RSP data line and that is controlled by the RSP control logic control signals and whose output drives the first stage RSP data line.

19. The processing array device of claim 17, wherein the first stage RSP data line out logic in each bit line section further comprises a latch whose input is an output of the read storage for the bit line section and whose output is a pull up enable control signal, a pull down transistor connected to the first stage RSP data line and a pull up transistor connected to the first stage RSP data line, wherein the second stage RSP data line out logic in each section further comprises a latch whose input is the first stage RSP data line and whose output is a pull up enable control signal, a pull down transistor connected to the second stage RSP data line and a pull up transistor connected to the second stage RSP data line, wherein the third stage RSP data line out logic in each section further comprises a latch whose input is the second stage RSP data line and whose output is a pull up enable control signal, a pull down transistor connected to the third stage RSP data line and a pull up transistor connected to the third stage RSP data line and wherein the fourth stage RSP data line out logic in each section further comprises a latch whose input is the third stage RSP data line and whose output is a pull up enable control signal, a pull down transistor connected to the fourth stage RSP data line and a pull up transistor connected to the fourth stage RSP data line.

20. The processing array device of claim 19, wherein the third stage RSP data line in logic further comprises an AND gate that generates a third stage RSP in pull-up enable control signal equal to a logical AND of the fourth stage RSP data line and the RSPreturn control signal and a pull up transistor connected to the third stage RSP data line whose enable line is the third stage RSP in pull-up enable control signal, wherein the second stage RSP data line in logic further comprises an AND gate that generates a second stage RSP in pull-up enable control signal equal to a logical AND of the third stage RSP data line and the RSPreturn control signal and a pull up transistor connected to the second stage RSP data line whose enable line is the second stage RSP in pull-up enable control signal and wherein the first stage RSP data line in logic further comprises an AND gate that generates a first stage RSP in pull-up enable control signal equal to a logical AND of the second stage RSP data line and the RSPreturn control signal and a pull up transistor connected to the first stage RSP data line whose enable line is the first stage RSP in pull-up enable control signal.

21. The processing array device of claim 9, wherein each bit line section further comprises circuitry that stores a state of the RSP data line.

22. The processing array device of claim 21, wherein each section further comprises circuitry that transmits the RSP data line outside of the processing array.

23. A response results method for a processing array device, the method comprising:
generating a computation result using a processing array device having a plurality of memory cells arranged in an array having a plurality of columns and a plurality of rows, each memory cell having a storage element wherein the array has a plurality of sections and each section has a plurality of bit line sections and a plurality of bit lines with one bit line per bit line section, wherein the memory cells in each bit line section are all connected to a single read bit line that generates the computation result and the plurality of bit lines in each section are distinct from the plurality of bit lines included in the other sections of the array;
logically combining, in each section, the computation results captured by the bit line sections in the section;
storing, in each bit line section, the logically combined computation results in one or more memory cells in the bit line section;
communicating, by an RSP data line connected to each bit line section, the combined computation result outside of the processing array device; and
communicating, by an RSP data line in each section, the computation results for the plurality of bit line sections in the section and generating, in each bit line section, a logical OR on the RSP data line of the computation results captured in all of the read storage devices in each of the bit line sections in the section and storing, in each bit line section, the combined computation result.

24. The method of claim 23 further comprising disabling, in each bit line section, a pull-up transistor connected to the RSP data line during the default state of the RSP line and enabling, when a RSP function is enabled, the pull-up transistor associated with each bit line section if the computational result captured in the read storage device is a logical one so that the bit line section circuitry generates the logical OR.

25. The method of claim 23 further comprising providing a plurality of RSP data lines wherein each RSP data line is connected to a larger number of bit line sections in the processing array device.

26. The method of claim 25, wherein the plurality of RSP data lines further comprises a plurality of RSP data line stages wherein each RSP data line stage is connected to a subset of the bit line sections in each section, a first particular RSP data line stage that is connected to all of the bit line sections in a section and a second particular RSP data line that is connected to each of the bit lines sections across a plurality of sections.

27. The method of claim 26 further comprising generating, by RSP outbound circuitry connected to each of the plurality of RSP data line stages, a logical OR, on each of the plurality of RSP data line stages, of the computation results captured in the read storage of the bit line sections.

28. The method of claim 27 further comprising producing, by RSP outbound circuitry in each section, a logical OR on each successive outbound stage RSP data line.

29. The method of claim 28 further comprising storing, in each bit line section, a state of the RSP data line.

30. The method of claim 29 further comprising transmitting, in each section, the RSP data line outside of the processing array.

31. The method of claim 27 further comprising propagating, at each of the plurality of RSP data line stages, the logical OR result, when the RSP outboard flow is halted, back to the each prior RSP data line stage including the first RSP data line stage and stores the result in the bit line sections.

32. The method of claim 31 further comprising enabling, by RSP inbound circuitry in each section, a state of the second particular RSP data line to all first RSP data lines spanned by the second particular RSP data line.

33. The method of claim 26, wherein the plurality of RSP data line stages further comprises a first RSP data line stage and a plurality of subsequent RSP data line stages.

34. The method of claim 26, wherein the plurality of section further comprises sixteen section wherein each section further comprises 2048 bit lines and wherein the plurality of RSP data lines further comprises a plurality of first stage RSP data lines with each first stage RSP data line spanning a unique group of sixteen bit line sections in the section, a plurality of second stage RSP data lines with each second stage RSP data line spanning a unique group of sixteen first stage RSP data lines in the section, a third stage RSP data line that spans the plurality of second stage RSP data lines in the section and a fourth stage RSP data line for all sixteen sections that spans the third stage data lines for all sections in the processing array device.

35. The method of claim 34 further comprising providing a first stage RSP data line out logic whose input is the output of the bit line section read storage device and that is controlled by the RSP control logic control signals and whose output drives the first stage RSP data line, a second stage RSP data line out logic whose input is the first stage RSP data line and that is controlled by the RSP control logic control signals and whose output drives the second stage RSP data line, a third stage RSP data line out logic whose input is the second stage RSP data line and that is controlled by the RSP control logic control signals and whose output drives the third stage RSP data line, and a fourth stage RSP data line out logic whose input is the third stage RSP data line and that is controlled by the RSP control logic control signals and whose output drives the fourth stage RSP data line.

36. The method of claim 35 further comprising providing a third stage RSP data line in logic whose input is the fourth stage RSP data line and that is controlled by the RSP control logic control signals and whose output drives the third stage RSP data line, a second stage RSP data line in logic whose input is the third stage RSP data line and that is controlled by the RSP control logic control signals and whose output drives the second stage RSP data line, and a first stage RSP data line in logic whose input is the second stage RSP data line and that is controlled by the RSP control logic control signals and whose output drives the first stage RSP data line.

37. The method of claim 23 further comprising engaging a RSP function to communicate the combined computation result.

38. The method of claim 37 further comprising temporarily disabling, at a first stage of outbound RSP flow, each pull-down transistor in each first stage RSP data line and temporarily enabling each pull-up transistor in each first stage RSP data line if the computation result is "1".

39. The method of claim 38 further comprising temporarily disabling, at each successive stage of outbound RSP flow, each pull-down transistor in each successive stage RSP data line and temporarily enabling each pull-up transistor in each successive stage RSP data line if the computation result is "1".

40. The method of claim 37, wherein engaging the RSP function further comprises engaging each successive stage of an outbound RSP flow one or more clock cycles after a previous stage of the outbound RSP flow is engaged.

41. The method of claim 40, wherein engaging the RSP function further comprises engaging all stages of an inbound RSP flow simultaneously over one or more clock cycles to generate the RSP result.

42. The method of claim 23 further comprising halting the outbound RSP flow wherein the communication of the computation results from the first stage RSP data line to the successive stage RSP data lines is stopped.

43. The method of claim 42 further comprising engaging an inbound RSP flow when the outbound RSP flow is halted wherein the computation results are communicated from the successive stage RSP data lines to the first stage RSP data line.

44. The method of claim 43, wherein the plurality of RSP data line stages further comprises a last RSP data line stage and wherein engaging the inbound RSP flow further comprises temporarily enabling, for each inbound pull-up transistor in each successive stage RSP data line if the state of the last RSP data line stage is "1" and temporarily enabling, for each inbound pull-up transistor in each RSP stage data line except the last RSP data line stage, if a prior RSP data line stage is "1".

* * * * *